(12) United States Patent
Igarashi et al.

(10) Patent No.: US 6,603,413 B2
(45) Date of Patent: Aug. 5, 2003

(54) VARIABLE-LENGTH DECODING APPARATUS AND METHOD

(75) Inventors: Susumu Igarashi, Kanagawa (JP); Tetsuya Tateno, Kanagawa (JP); Makoto Satoh, Tokyo (JP); Yukio Chiba, Kanagawa (JP); Katsumi Otsuka, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/067,223

(22) Filed: Feb. 7, 2002

(65) Prior Publication Data

US 2002/0154042 A1 Oct. 24, 2002

(30) Foreign Application Priority Data

Feb. 7, 2001 (JP) ........................................ 2001-031582
Dec. 6, 2001 (JP) ........................................ 2001-373270

(51) Int. Cl.[7] .............................................. H03M 7/40
(52) U.S. Cl. ........................................ 341/67; 341/65
(58) Field of Search .............................. 341/67, 50, 65

(56) References Cited

U.S. PATENT DOCUMENTS

| 5,428,356 | A | | 6/1995 | Ozaki | ........................ 341/67 |
| 5,539,401 | A | * | 7/1996 | Kumaki et al. | ................ 341/67 |
| 5,572,208 | A | * | 11/1996 | Wu | .............................. 341/67 |
| 5,710,598 | A | | 1/1998 | Ukai et al. | ................... 348/408 |
| 5,751,223 | A | | 5/1998 | Turner | .................... 340/825.54 |
| 6,297,754 | B1 | * | 10/2001 | Miyasaka et al. | ............. 341/65 |
| 6,313,767 | B1 | | 11/2001 | Ishizuka et al. | ............... 341/67 |

FOREIGN PATENT DOCUMENTS

JP          3015001       12/1999      ............ H03M/7/40

* cited by examiner

*Primary Examiner*—Peguy JeanPierre
(74) *Attorney, Agent, or Firm*—Fitzpatrick, Cella, Harper & Scinto

(57) ABSTRACT

This invention implements a variable-length code pipeline decoding process as hardware by providing additional bit processing means, reducing the load on external control, and clarifying encoded data shift means. For this purpose, in order to determine a code length and additional bit length, two different decode processes are executed, the overall process is separated into three stages, i.e., a stage for shifting out a code word of encoded data, a decode processing stage, and a symbol determination & additional bit processing stage, and these stages are executed in a pipeline manner.

21 Claims, 31 Drawing Sheets

FIG. 4

| VARIABLE LENGTH CODE 1 | ADDITIONAL BIT 1 | VARIABLE LENGTH CODE 2 | ADDITIONAL BIT 2 | VARIABLE LENGTH CODE 3 | ADDITIONAL BIT 3 | |

FIG. 9

|  | GATE SCALE | OUTPUT INFORMATION |
|---|---|---|
| DECODE PROCESSOR 1 | GATE SCALE INCREASES WITH INCREASING NUMBER OF CODE WORD ENTRIES | CODE LENGTH<br>CODE LENGTH+ ADDITIONAL BIT LENGTH<br>MEMORY ADDRESS |
| DECODE PROCESSOR 2 | GATE SCALE IS CONSTANT | CODE LENGTH<br>MEMORY ADDRESS |

FIG. 14

00A01AA1011AAAA11011AA11010AAAAA100AAA00A100AAA00A00A00A01AA01AA100AAA

FIG. 15

| ALL-SYMBOL GENERATE DECODER | | SPECIFIC SYMBOL GENERATE DECODER | |
|---|---|---|---|
| CODE WORD | RRRR/SSSS | CODE WORD | RRRR/SSSS |
| 00 | 0/1 | 00 | 0/1 |
| 01 | 0/2 | 01 | 0/2 |
| 100 | 0/3 | 100 | 0/3 |
| 1010 | EOB | | |
| 1011 | 0/4 | | |
| 1100 | 1/1 | | |
| 11010 | 0/5 | | |
| 11011 | 1/2 | | |

FIG. 16

| CYCLE | OUTPUT FROM SHIFT-OUT MEANS | OUTPUT FROM ALL-SYMBOL GENERATE DECODER RRRR/SSSS | OUTPUT FROM LEFT-SHIFT MEANS | OUTPUT FROM SPECIFIC SYMBOL GENERATE DECODER RRRR/SSSS | SHIFT AMOUNT | DATA SIZE |
|---|---|---|---|---|---|---|
| 0 | 00A01AA1011AAAA1 | 0/1 | 01AA1011AAAA1(000) | 0/2 | 7 | 16 |
| 1 | 1011AAAA11011AA1 | 0/4 | 11011AA1(00000000) | MISS | 8 | 16 |
| 2 | 11011AA11010AAAA | 1/2 | 11010AAAA(0000000) | MISS | 7 | 16 |
| 3 | 11010AAAAA100AAA | 0/5 | 100AAA(0000000000) | 0/3 | 16 | 16 |
| 4 | 00A100AA00000000 | 0/1 | 100AA(00000000000) | WAIT | 3 | 8 |
| 5 | 100AAA00A00A00A0 | 0/3 | 00A00A00A0(000000) | 0/1 | 9 | 16 |

FIG. 25

| SSSS | MASK PATTERN |
|---|---|
| 0 | 00000000000 |
| 1 | 10000000000 |
| 2 | 11000000000 |
| 3 | 11100000000 |
| 4 | 11110000000 |
| 5 | 11111000000 |
| 6 | 11111100000 |
| 7 | 11111110000 |
| 8 | 11111111000 |
| 9 | 11111111100 |
| 10 | 11111111110 |
| 11 | 11111111111 |

VARIABLE-LENGTH DECODING APPARATUS AND METHOD

FIELD OF THE INVENTION

The present invention relates to a decoding apparatus and method for encoded data of still images and moving images.

BACKGROUND OF THE INVENTION

Conventionally, a scheme using an entropy coding technique using a variable-length code is well known as one compression coding technique of still images and moving images. This technique is also adopted in JPEG (Joint Photographic Expert Group) as an international standard. In recent years, especially, many hardware implementation means using a Huffman code table as a variable-length code have been proposed. Such prior art will be explained below.

A conventional decoding apparatus comprises a shift means which comprises a circuit capable of shifting input encoded data for respective bits, a decoder for obtaining the code length and frequency of generation of a head code output from the shift means by comparing the encoded data output from the shift means and a pre-stored minimum or maximum code word of each code length, a symbol memory for storing decoded data (symbol data) in the order of frequency of generation, an additional bit processor for executing an additional bit process, and a shift amount select means for controlling a shift amount of the shift means.

The shift amount select means selects, as the shift amount of the shift means, the code length obtained by the decoder in an odd cycle, and an additional bit length output from the symbol memory in an even cycle. In this example, the throughput of the decoding process is always 0.5 symbols/cycle. In addition, the following technique for improving the throughput of the decoding process is known.

In this technique, a decoding apparatus comprises two different decoders, and a first decoder executes the same process in the aforementioned decoder. On the other hand, a second decoder pre-stores code words with high frequencies of generation and symbol data corresponding to these code words, and outputs symbol data in one cycle for a code word with a high frequency of generation.

For other code words, the first decoder generates an address of the symbol memory, and outputs symbol data output from the symbol memory in the next cycle as decoded data. According to this example, a throughput of a maximum of 1 symbol/cycle can be obtained.

In order to realize a high-speed decoding process, a specific decoding means must be implemented as hardware and the circuit must be operated at high frequency. However, the conventional apparatus suffers the following problems.

Conventionally, since an additional bit processing means is unknown in the decoding process, it is difficult to attain hardware implementation. Especially, when a process is done at the throughput of a maximum of 1 symbol/cycle, since the additional bit processor must at least cope with this processing rate, a hardware implementation means of the additional bit processor is very important upon realizing a high-speed circuit.

When two different blocks (second decoder and symbol memory) output decoded data depending on input encoded data, since their latencies (execution times) are different, the input timings of symbol data to a selector deviate from each other. Hence, control that considers this timing deviation is required, resulting in complicated control.

It is hard to implement a pipeline process. Even if code lengths corresponding to the code words stored in the second decoder are stored in advance and a code length corresponding to a selected code word is shifted out from the shift means in one cycle to solve the aforementioned problem, since the output from the decoding apparatus is one cycle, an arithmetic operation for the decoding process, e.g., an additional bit arithmetic operation must be done in one cycle, and it is difficult to realize a pipeline structure in synchronous circuit design.

In order to achieve efficient, high-speed processes, the processing unit must be shifted for each encoded data. However, conventionally, the shift amount control of the input means to the decoding apparatus is unknown.

FIG. 11 shows the arrangement of a variable-length decoding apparatus as prior art 1. This decoding apparatus comprises a shift-out means (to be referred to as "shift" hereinafter) 1201 that comprises a circuit capable of shifting input encoded data for respective bits, a decoder 1203 for obtaining the code length and frequency of generation of a head code output from the shift 1201 by comparing the encoded data output from the shift 1201 and a minimum or maximum code word of each code length, which is stored in advance, a symbol memory 1205 for storing decoded data (symbol data RRRR/SSSS) in the order of frequency of generation, an additional bit processor 1202 for executing an additional bit process, and a shift amount select means 1204 for controlling the shift amount of the shift 1201.

The shift amount select means 1204 selects, as the shift amount of the shift 1201, the code length obtained by the decoder 1203 in an odd cycle, and an additional bit length output from the symbol memory 1205 in an even cycle.

FIG. 12 shows the arrangement of prior art 2 which can improve the throughput of the decoding process in addition to the decoding apparatus of prior art 1. In this prior art, a high-speed symbol decoder 1352 executes a high-speed decoding process of a plurality of selected symbols, and a symbol decoder 1353 decodes other symbols. As an example of a select means of symbols to be decoded by the high-speed symbol decoder 1352, a plurality of symbols in descending order of frequency of generation, or symbols with zero runlength may be selected.

A characteristic feature of prior art 2 lies in that priority is given to the decoding process of the high-speed symbol decoder 1352. If input encoded data hits a code word corresponding to a symbol registered in the high-speed symbol decoder 1352, the decoding result of the high-speed symbol decoder 1352 is preferentially selected as an output.

FIG. 13 shows prior art 3 as a technique for further improving the throughput of prior art 2. A variable-length decoding apparatus according to prior art 3 comprises a 1-code word decoder 1403 for decoding a head code word, and a 2-successive code word decoder 1402 capable of decoding a successive sequence of two ode words from the head with high frequency of generation, and is characterized in that priority is given to the 2-successive code word decoder 1402. If a hit has occurred in the 2-successive code word decoder 1402, since two code words can be decoded at one time, the throughput can be further improved.

As the encoded data sizes of still images and moving images increase, the required processing performance for an encoding processing apparatus becomes considerably high. Especially, since the variable-length decoding apparatus must decode a variable-length code, it is very difficult to improve the throughput. For this reason, various solutions have been proposed so far, but the following problems remain unsolved.

The throughput varies depending on the hit ratio of the high-speed symbol decoder 1352. Even if all data hit, the performance of a maximum of only one symbol per decoding sequence is obtained. This throughput is insufficient in consideration of the performance required for a variable-length decoding apparatus in the future. When the symbol decoder 1353 can decode in one cycle, an effect obtained upon adopting a parallel arrangement with the high-speed symbol decoder 1532 is lost. Such problem occurs when a table that stores symbol data as a decoding result comprises an asynchronous RAM or hardwired. The recent advance of semiconductor techniques allows to operate at higher clock frequency even if the circuit arrangement remains the same, and a conventional circuit which processes in two cycles can now process in one cycle.

As in prior art 2, the throughput varies depending on the hit ratio of the 2-successive code word decoder 1402, and the performance of a maximum of two code words per decoding sequence can be obtained. However, this technique can be implemented in Huffman coding used in MPEG, but cannot be applied to JPEG. This is because variable-length encoded data in JPEG is made up of a Huffman code word and additional bit. For this reason, the 2-successive code word decoder 1402 cannot decode if it simply compares two successive code words with input encoded data, and must consider an additional bit corresponding to a head code word to be decoded by the 1-code word decoder 1403.

SUMMARY OF THE INVENTION

It is an object of the present invention to implement a variable-length decoding apparatus that can hardly achieve high-speed operations as a pipeline process consisting of three stages by synchronous design using a synchronous RAM. It is another object of the present invention to allow two different decoders to share an additional bit processing circuit and decoded data storage means, and to improve the throughput while minimizing an increase in circuit scale.

In order to achieve the above object, a variable-length decoding apparatus of the present invention comprises the following arrangement.

That is, a variable-length decoding apparatus for decoding encoded data, comprises:

shift means for shifting out a code word and an additional bit corresponding to the code word of input encoded data for each cycle;

a symbol memory for storing decoded data corresponding to a plurality of N code words contained in the input encoded data;

first decode processing means for generating an address of the symbol memory, a code length, and an additional bit length for each of Nt code words fewer than the N code words of the code words input from the shift means;

second decode processing means for generating a code length and an address of the symbol memory for each of the N code words;

address select means for selecting one of the two addresses of the symbol memory input from the first and second decode processing means;

first additional bit processing means for shifting bits of the output from the shift means to the left by the code length input from one of the first and second decode processing means;

second additional bit processing means for shifting bits of the output from the first additional bit processing means to the right by an amount corresponding to symbol data output from the symbol memory; and operation control means for outputting a shift amount to the shift means.

It is still another object of the present invention to provide a decoding apparatus and method, which can be applied to decoding of JPEG and MPEG encoded data, and can obtain a high throughput.

In order to achieve the above object, for example, one decoding apparatus of the present invention comprises the following arrangement.

That is, a decoding apparatus for decoding variable-length encoded data, and outputting symbol data, comprises:

first shift-out means for shifting out a code word of input encoded data in accordance with shift amount select means, and outputting a head code word and subsequent encoded data;

first decode means for decoding the head code word output from the first shift-out means, and generating first symbol data and a bit length N (N is an integer) of the code word;

second shift-out means for further shifting the head code word and subsequent encoded data output from the first shift-out means on the basis of the bit length N output from the first decode means, and outputting a subsequent first code word; and second decode means for, when the subsequent first code word output from the second shift-out means belongs to one of a code word group obtained by selecting in advance some of all code words which form the encoded data, generating second symbol data as a decoding result and a bit length M (M is an integer) of the code word, wherein the shift amount select means determines, as a shift amount of the first shift-out means, a shift amount by selecting a bit length N+M obtained by adding the bit lengths N and M when the second decode means generates the second symbol data, and by selecting the bit length N in other cases.

In the above arrangement, a maximum of two symbol data can be output in one cycle, and the throughput can be remarkably improved compared to the prior art.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 4 shows the format of encoded data;

FIG. 9 is a table comparing the decode processors 1 (103) and 2 (104);

FIG. 14 shows an example of encoded data input to a decoding apparatus of the second embodiment;

FIG. 15 is a table showing the relationship between symbols and code words to be decoded by a specific symbol generate decoder 1103 and all-symbol generate decoder 1104;

FIG. 16 is a table showing the states of respective data for respective cycles in the second embodiment;

FIG. 25 is a table showing the relationship between a mask pattern and SSSS stored in a mask pattern table in the third and sixth embodiments;

DETAILED DESCRIPTION OF THE PREFERRED EMBODIMENTS

Preferred embodiments of the present invention will be described in detail hereinafter.

Figure 1:
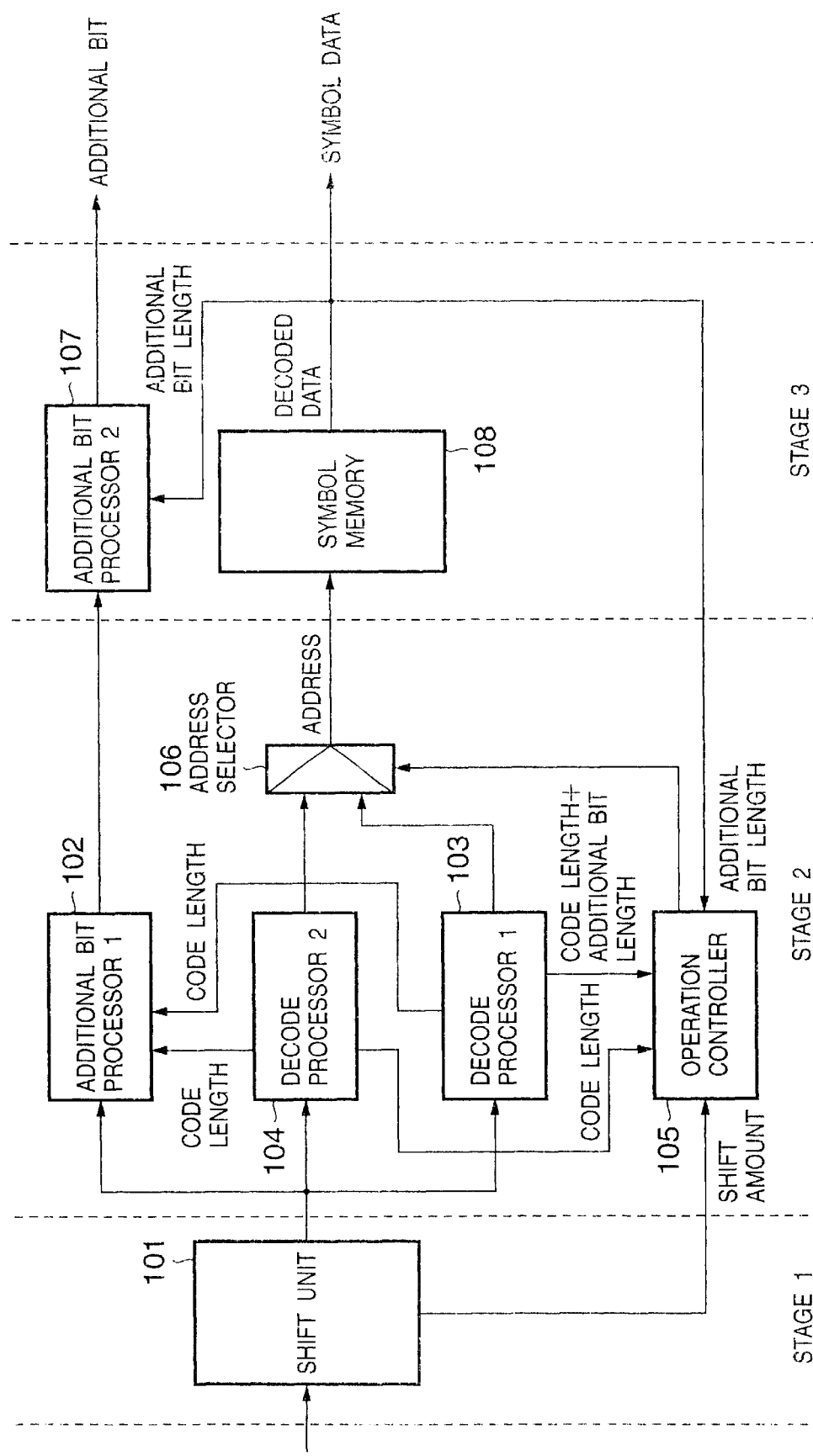
FIG. 1 is a block diagram of a variable-length decoding apparatus according to an embodiment of the present invention.

FIG. 1 shows an embodiment of a variable-length decoding apparatus using the present invention. A shift means or unit 101 shifts out each code word of variable-length encoded data for each cycle using a left bit shift processing circuit. Since the shift unit 101 uses a flip-flop, it latches output data of the left bit shift processing circuit for each cycle. This process is defined as stage 1 of a pipeline process.

Figure 2:
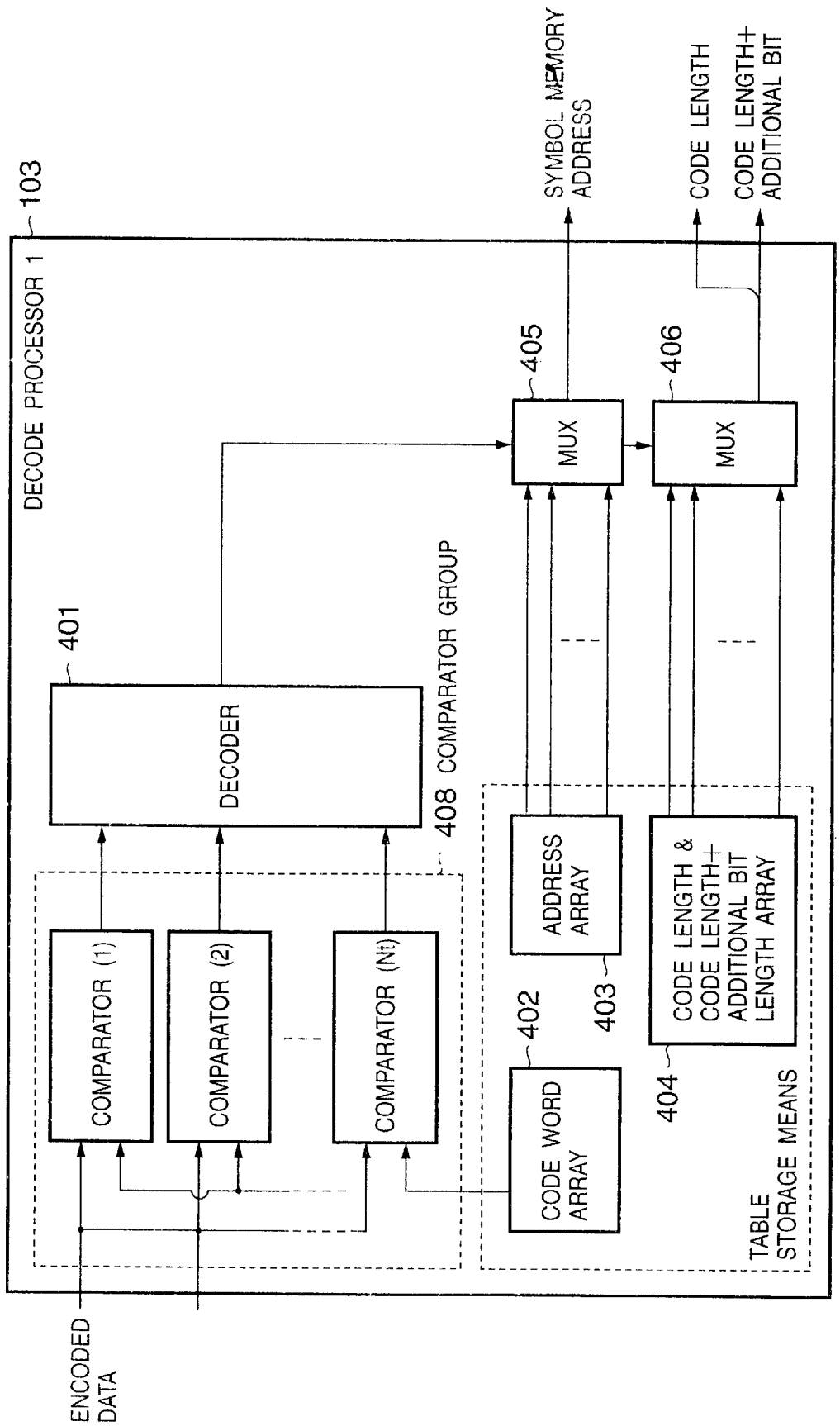
FIG. 2 is a block diagram showing the internal arrangement of a decode processor 1 (103) in FIG. 1 in the embodiment of the present invention.
Figure 6:
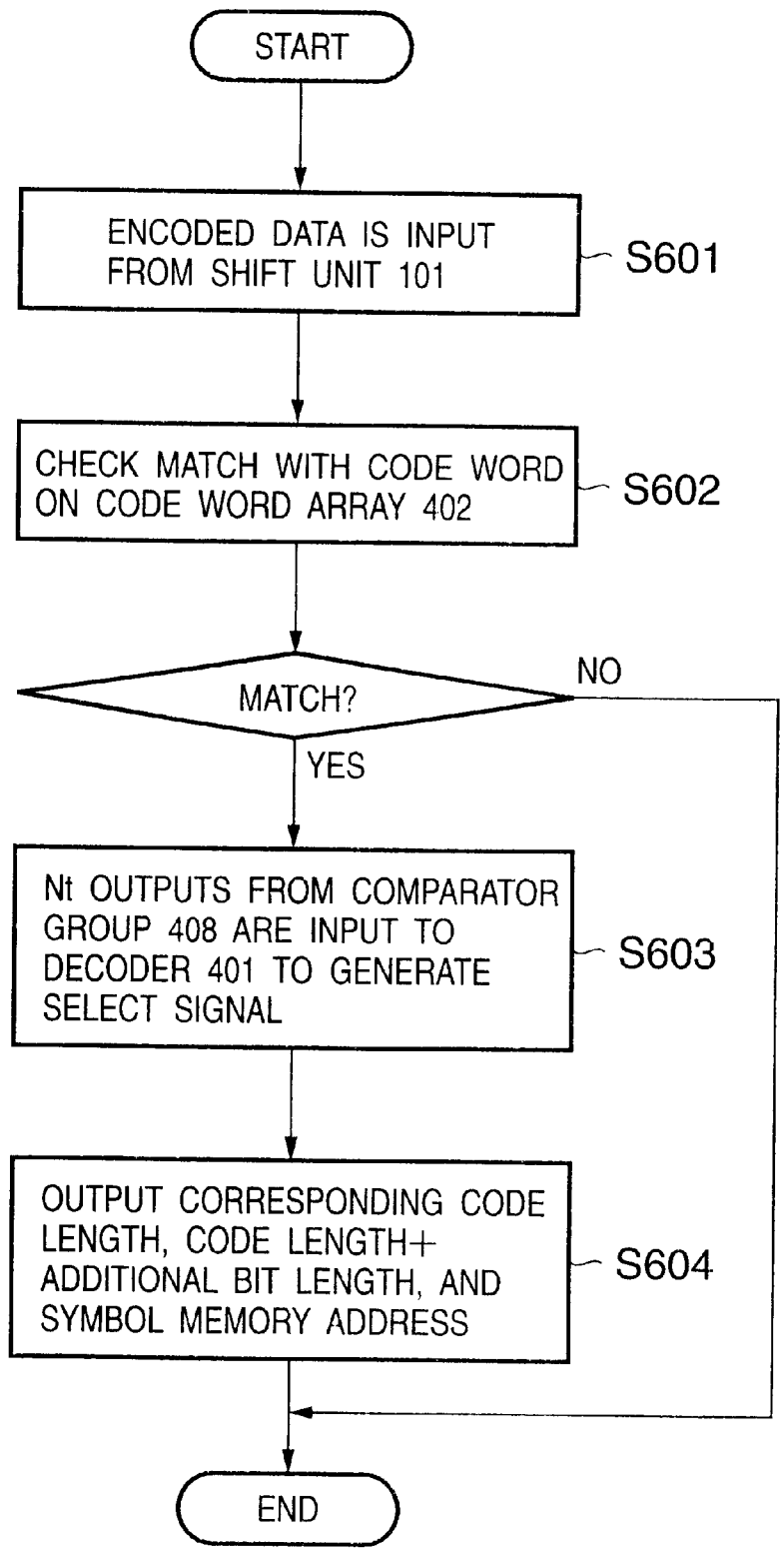
FIG. 6 is a flow chart showing the flow of the process in the decode processor 1 in the embodiment of the present invention.

The process of stage 2 will be described in detail below. FIG. 2 shows the internal arrangement of a decode processor 1 (103). FIG. 6 is a flow chart showing the flow of the process in the decode processor 1. A table storage means comprises a code word array 402 which comprises a flip-flop, and stores Nt (N>Nt>0) of N (N>1) code words present in advance in a variable-length code table, a code length & code length +additional bit length array 404 for storing two different types of numbers of bits, i.e., Nt code lengths corresponding to the code word array 402, and Nt code lengths+additional bit lengths M (M>0), and an address array 403 for storing Nt addresses of a symbol memory 108. It is checked if code words output from the code word array 402 in the table storage means match the outputs from the shift unit 101 in Nt comparators of a comparator group 408. In this checking, since the code lengths of code words present in the code word array 402 are known, each of the Nt comparators compares for only a code length to be compared. That is, each comparator in the comparator group 408 compares for the number of bits according to a code length to be compared, which ranges from 1 bit (minimum) to a maximum code length.

The output signals from these Nt comparators in the comparator group 408 are input to a decoder 401, which generates a select signal for selecting one of Nt data of the address array 403 and the code length & code length+additional bit length array 404. The outputs from an MUX 406 are two different signals indicating the code length and the M bits. The signal indicating the M bits is output to an operation controller 105 in FIG. 1, and the code length is output to an additional bit processor 1 (102). Output data from an MUX 405 is used as the address of the symbol memory 108.

Figure 5:
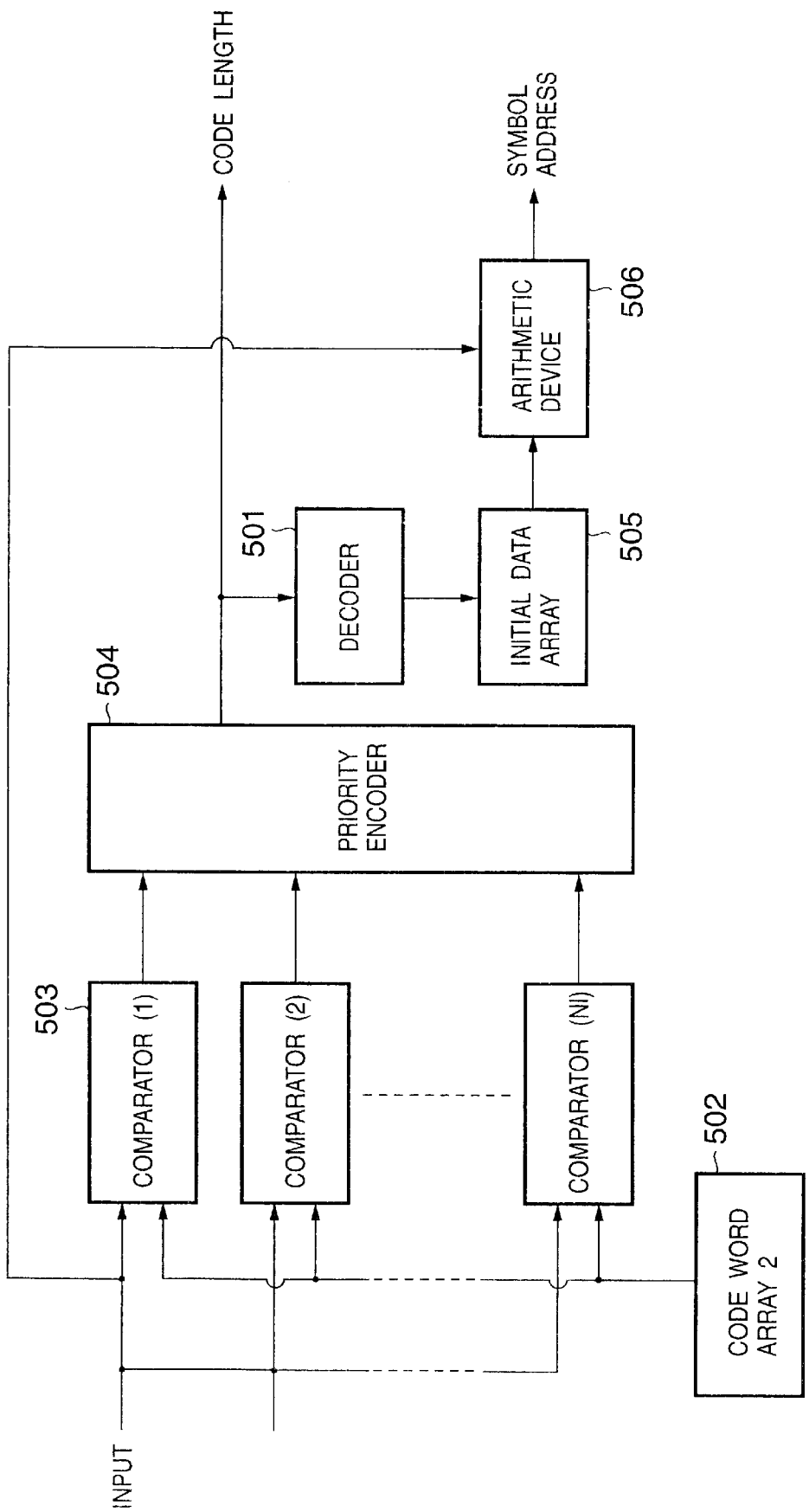
FIG. 5 is a block diagram showing the internal arrangement of a decode processor 2 in FIG. 1 in the embodiment of the present invention.
Figure 7:
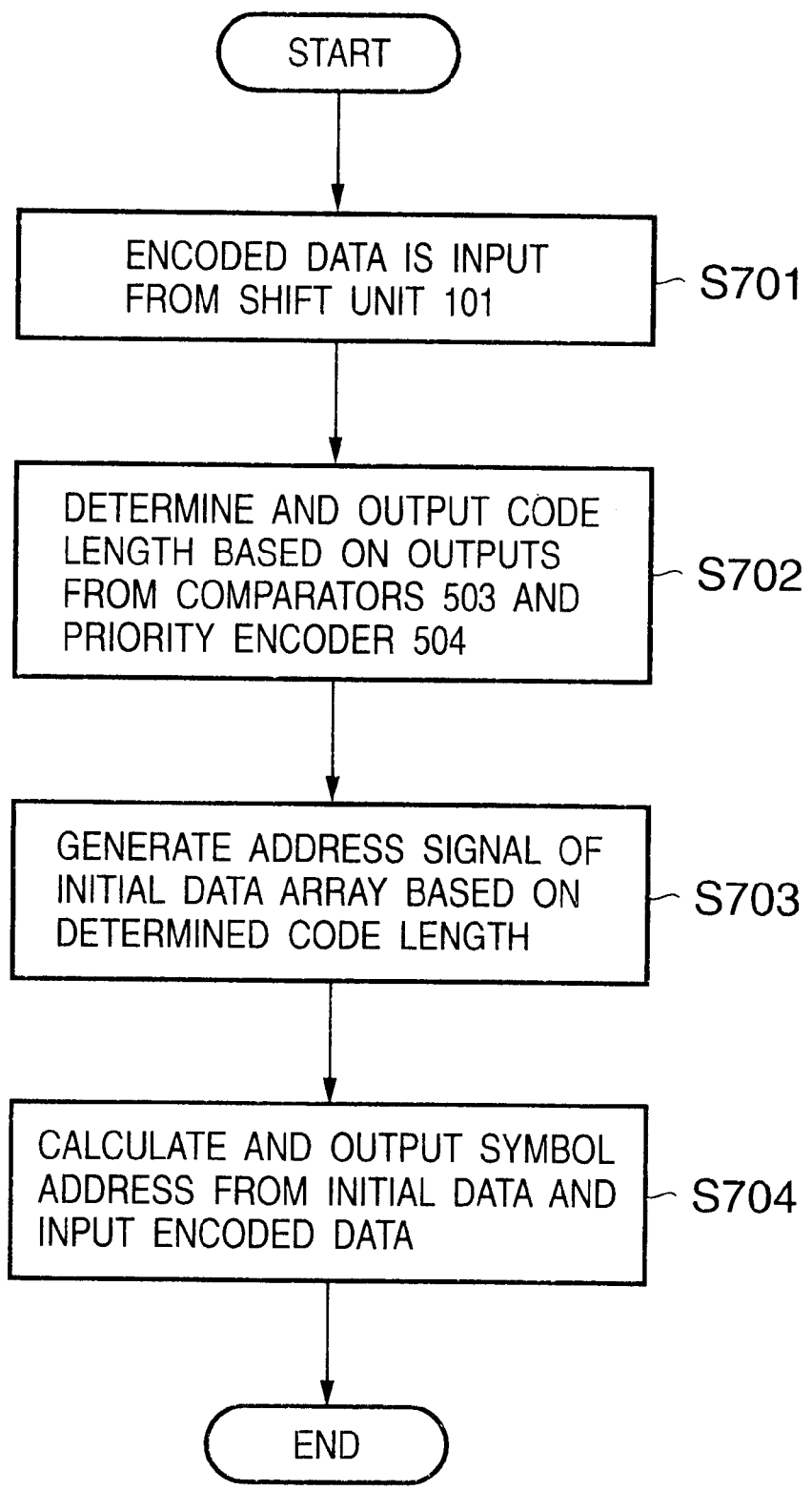
FIG. 7 is a flow chart showing the flow of the process in the decode processor 2 in the embodiment of the present invention.

On the other hand, the arrangement of a decode processor 2 (104) is as shown in FIG. 5. The flow of the process in the decode processor 2 is as shown in the flow chart of FIG. 7. In this processor, maximum or minimum code words for respective code lengths are pre-stored in a code word array 502, and the code length of input encoded data (S701) is obtained using comparators 503 and a priority encoder 504 (S702). If the code word array 502 stores maximum code words, the priority of the priority encoder becomes higher in the order from larger code length; when the array 502 stores minimum code words, the priority becomes lower in the order from smaller code length. Since the number of comparators corresponds the number ($N_1$) of code lengths, the gate scale is constant. An initial data array 505 pre-stores initial data corresponding to maximum or minimum code words for respective code lengths on the code word array 502. Access to the initial data array is made using a decoder 501 on the basis of the obtained code length (S703). The address of the symbol memory 108 is obtained by adding initial data corresponding to the obtained code length and the input encoded data by an arithmetic device 506 (S704).

For example, when initial data of minimum code words are stored, the address of the symbol memory is obtained by:

ADDR=VLCin−VLCmin+ADDRbase=VLCin+(ADDRbase−VLCmin)

where ADDR is the address of the symbol memory, VLCin is lower 8 bits of a code word which is currently shifted out by the shift unit 101, VLCmin is the minimum code word of an identical code length, and ADDRbase is the address of the minimum code word in the symbol memory. Lower 8 bits obtained by computing (ADDRbase−VLCmin) of the right-handed side correspond to initial data. If the code word, which is currently shifted out by the shift unit 101, is less than 8 bits, "0" or "0"s is or are padded in the vacant upper bit or bits.

FIG. 9 compares the decode processors 1 (103) and 2 (104). In a cycle in which encoded data can be decoded by the decode processor 1, since the variable code length and additional bits can be shifted out in one cycle with respect to the shift unit 101, successive encoded data can be decoded in the next cycle.

On the other hand, when decoding is made by the decode processor 2, the obtained code length is stored in the first cycle, and a shift-out process is done by adding the code length and an additional bit length obtained from the symbol memory 108 in the next cycle. Hence, two cycles are required until the decoding process of encoded data starts.

Figure 8:
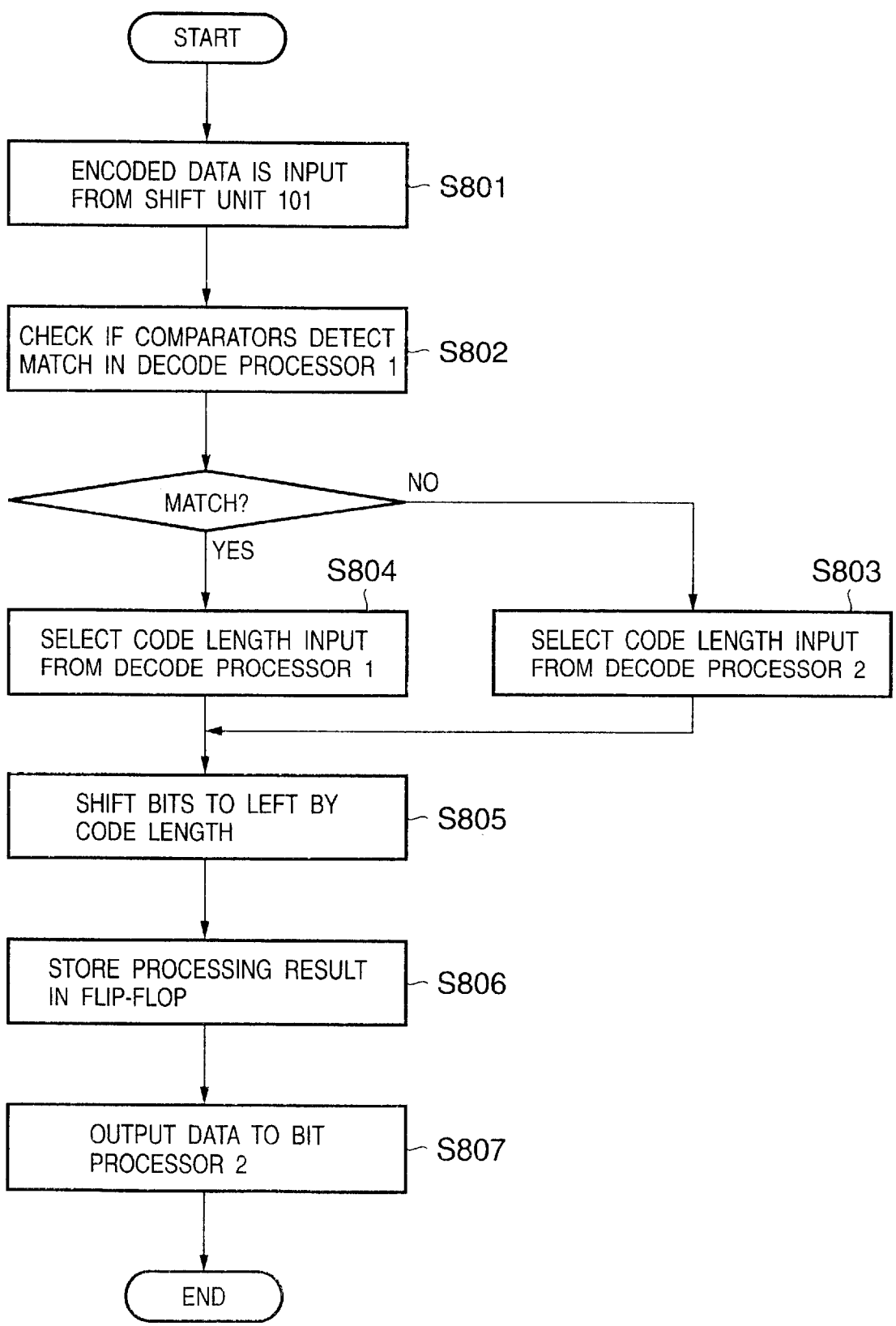
FIG. 8 is a flow chart showing the flow of the process in an additional bit processor 1 in the embodiment of the present invention.

An address selector 106 selects the output from the decode processor 1 (103) in a cycle in which at least one match is detected by the Nt comparators in the decode processor 1 (103), and selects the output from the decode processor 2 (104) in other cycles. On the other hand, the additional bit processor 1 (102) receives the code lengths from the decode processors 1 (103) and 2 (104). FIG. 8 is a flow chart of the process in the additional bit processor 1.

In the process in the additional bit processor 1, in a cycle in which at least one match is detected by the Nt comparators in the decode processor 1 (103), the code length input from the decode processor 1 (103) is selected, and a left bit shift operation is done (S802, S804, S805). In other cases, the code length input from the decode processor 2 is selected, and a bit shift operation is made (S803). In this case, the result of the bit shift process is stored in a flip-flop for each cycle (S806). The aforementioned operations are made in stage 2 of the pipeline process.

The process executed in stage 3 of the pipeline process will be explained below. In stage 3, the output from the symbol memory 108 and the output from the additional bit processor 1 (102) are used. An additional bit processor 2 (107) performs a right bit shift operation of input data from the flip-flop of the additional bit processor 1 (102) using an additional bit length as a part of symbol data output from the symbol memory 108 as a shift amount.

The result of this shift operation is used as output additional bit data of this decoding apparatus. Symbol data output from the symbol memory 108 is directly used as output symbol data of this decoding apparatus. If the address output from the decode processor 2 (104) was used in the previous cycle, the operation controller 105 adds the code length stored in the previous cycle, and an additional bit length as a part of symbol data output from the symbol memory 108, and outputs the sum to the shift unit 101.

Figure 3:
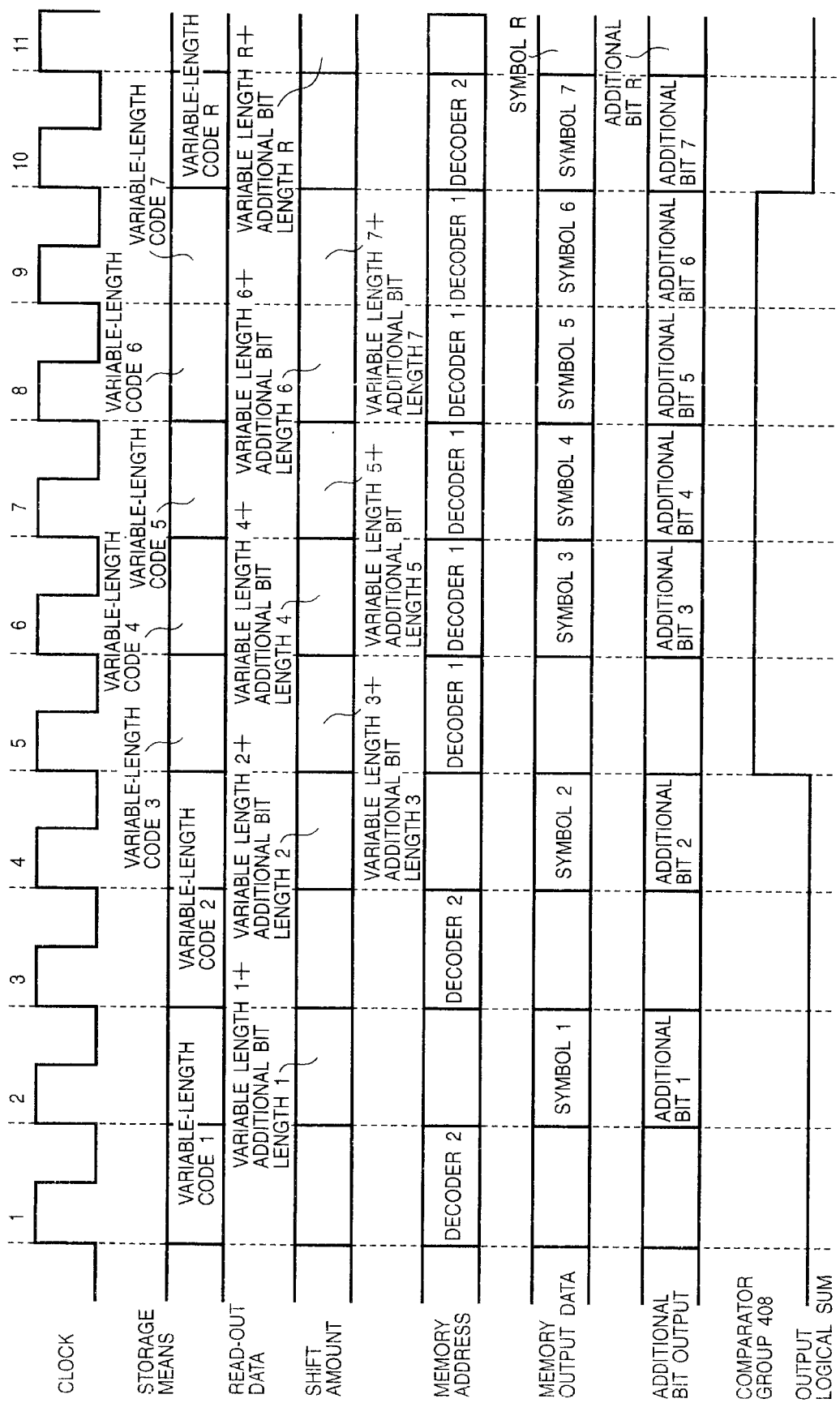
FIG. 3 is a timing chart of the embodiment of the present invention.

FIG. 3 is a timing chart of the variable-length decoding apparatus of this embodiment, and FIG. 4 shows an example of encoded data input to this decoding apparatus.

In cycle 1, variable-length code 1 is shifted out by the shift unit 101 as it is shifted up to the MSB side. The decode processors 1 (103) and 2 (104) receive identical encoded data. Variable-length code 1 is not present in the table storage means of the decode processor 1 (103), and all the outputs from the comparator group 408 are false.

On the other hand, the decode processor 2 (104) calculates and outputs the code length of variable-length code 1, and the address of the symbol memory 108. The additional bit processor 1 (102) executes a left bit shift process of output data from the shift unit 101 on the basis of the code length input from the decode processor 2 (104), and stores the result in the flip-flop. The operation controller 105 stores the code length input from the decode processor 2 (104) in the flip-flop.

In cycle 2, the symbol memory 108 outputs symbol data corresponding to variable-length code 1 as decoded data. The additional bit processor 2 executes a right bit shift process of data input from the additional bit processor 1 (102) using a part of symbol data as a shift amount, and outputs the result as additional bit data. The operation controller 105 also receives an additional bit length as a part of symbol data, adds the code length stored in the previous cycle and the additional bit length, and outputs the sum as a shift amount to the shift unit 101.

In cycles 3 and 4, the same operations as in cycles 1 and 2 are done, respectively. In cycle 5, variable-length code 3, which is currently shifted out by the shift unit 101, matches one of code words pre-stored in the flip-flop in the decode processor 1 (103). The additional bit processor 1 (102) executes a left bit shift process based on the code length input from the decode processor 1 (103). The operation controller 105 outputs the code length+additional bit length input from the decode processor 1 (103) to the shift unit 101 as a shift amount.

That is, in the next cycle 6, additional bits have already been shifted out, so the next variable-length code 5 is shifted out from the shift unit 101 this time. In this cycle as well, the decode processor 1 (103) detects a match of a Huffman code word, and the additional bit processor 1 (102) and operation controller 105 execute the same operations as in cycle 5. On the other hand, in stage 3 of the pipeline process, the symbol memory 108 outputs symbol data corresponding to variable-length code 3 as decoded data, and the additional bit processor 2 (107) executes a right bit shift process using a part of symbol data as a shift amount, and outputs the result of the bit shift process as additional bit data.

The same processes are done in cycles 7 to 9. In cycle 10, the decode processor 1 (103) does not detect any match with code words, and the code length of the decode processor 2 (104) and the address of the symbol memory are enabled in stage 2 of the pipeline process. In stage 3 of the pipeline process, symbol data corresponding to variable-length code 7 and additional bits are output.

As described above, according to this embodiment, a variable-length decoding apparatus which can hardly attain high-speed operations can be implemented as a pipeline process consisting of three stages by synchronous design using a synchronous RAM. The additional bit processing circuit and decoded data storage means can be shared by two different types of decoders and, hence, the throughput can be improved while minimizing an increase in circuit scale.

Second Embodiment

Figure 10:
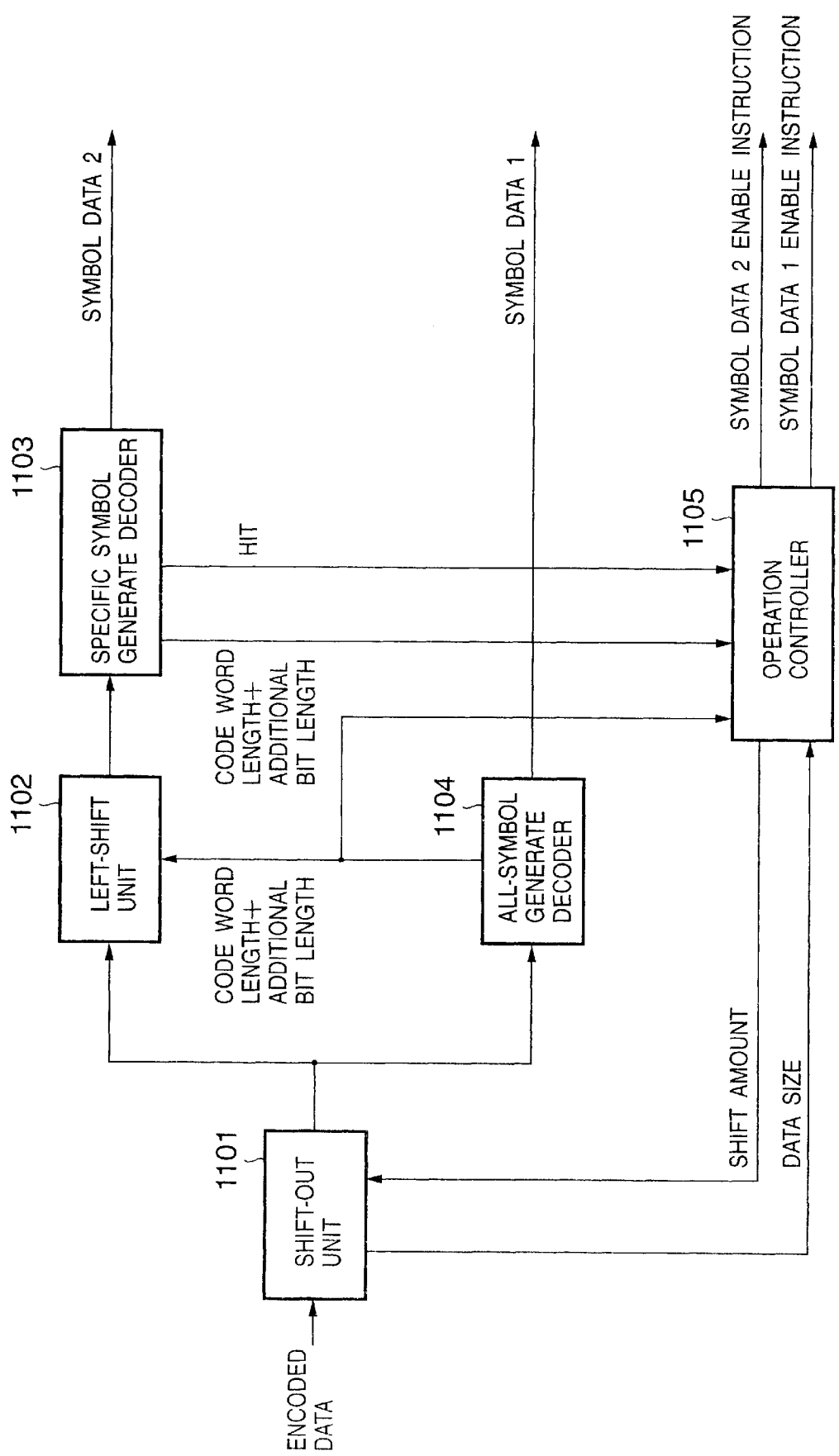
FIG. 10 is a block diagram of a decoding apparatus according to the second embodiment of the present invention.
Figure 11:
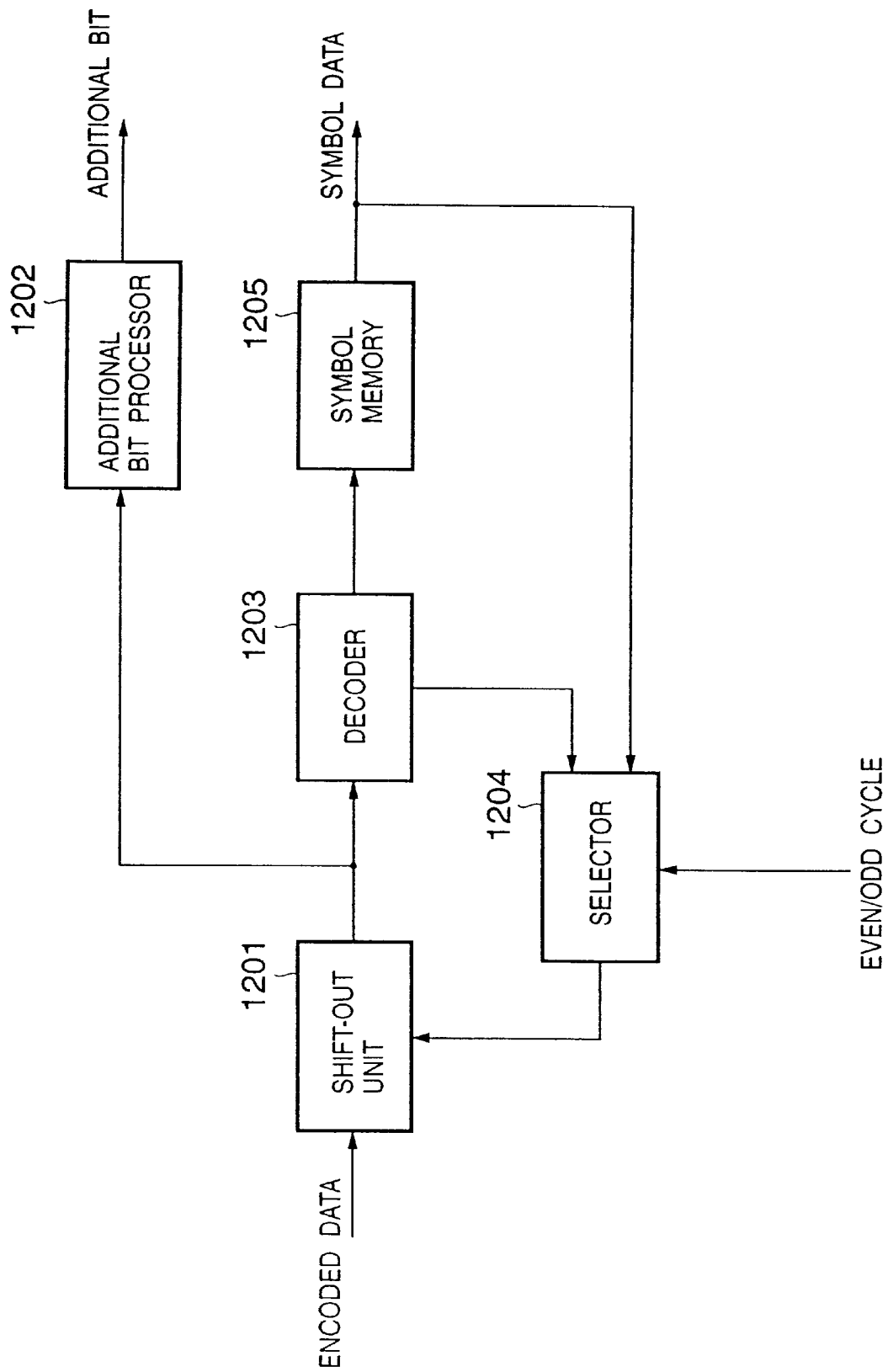
FIG. 11 is a block diagram of a conventional decoding apparatus.
Figure 12:
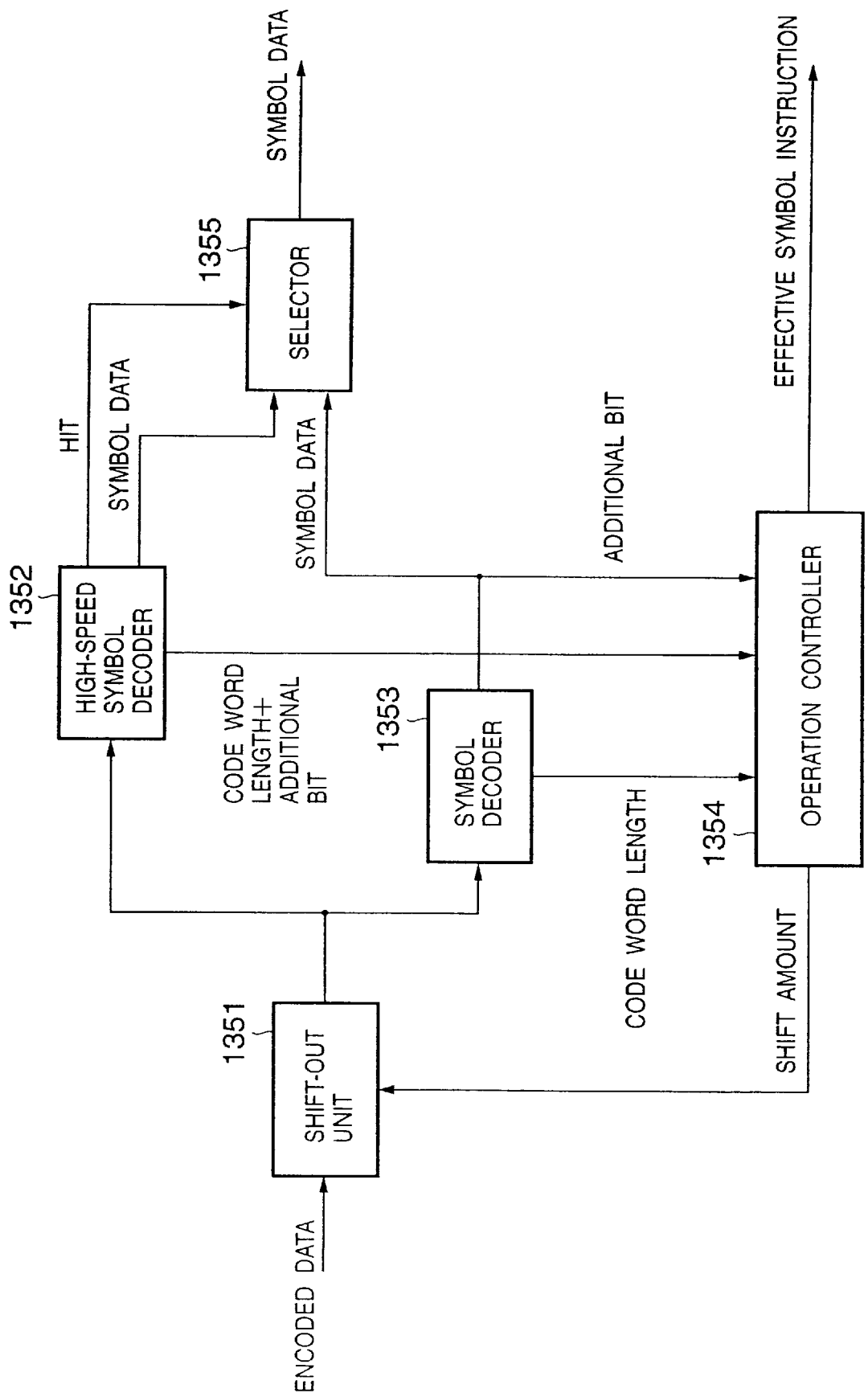
FIG. 12 is a block diagram of a conventional decoding apparatus.
Figure 13:
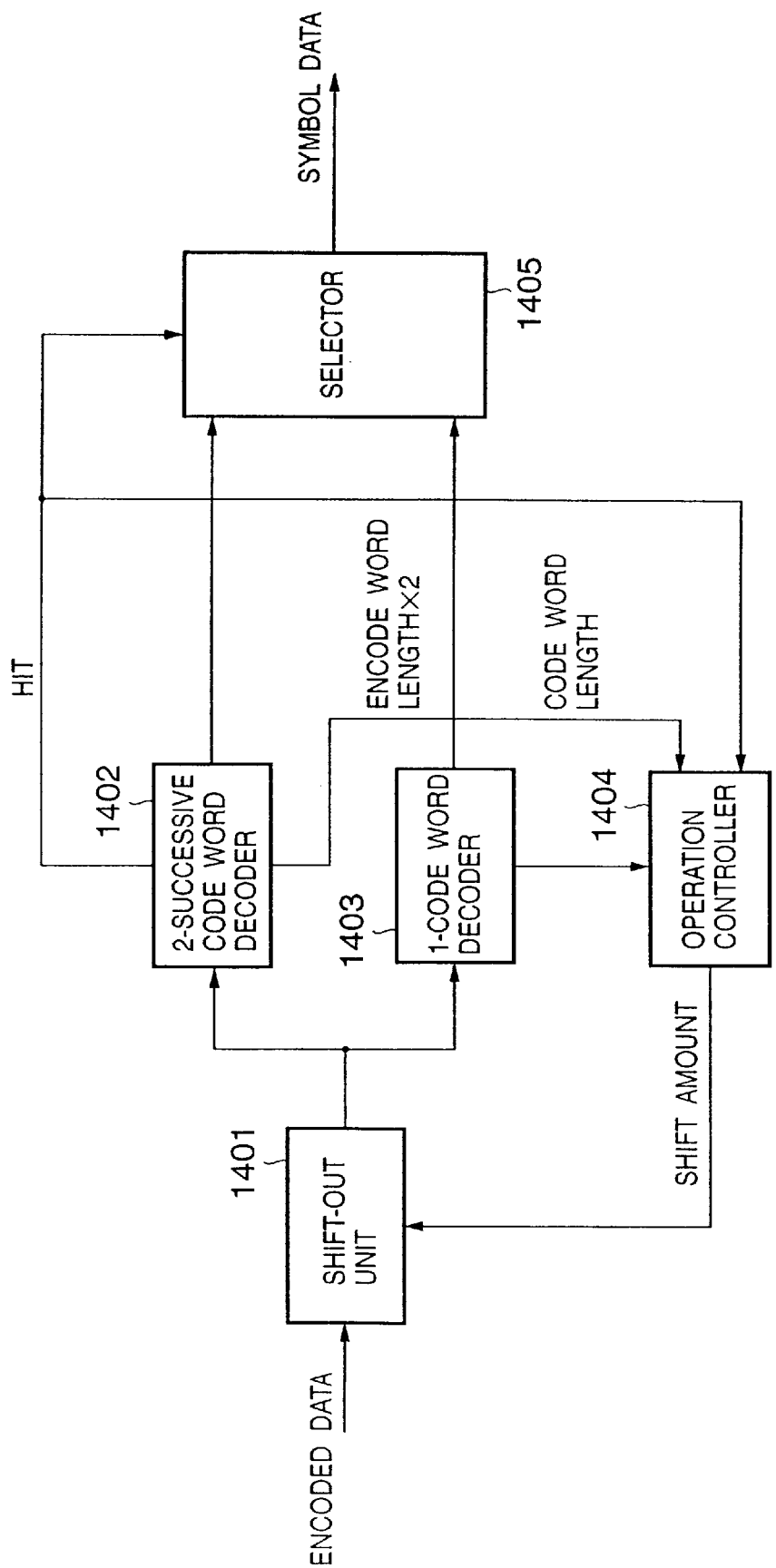
FIG. 13 is a block diagram of a conventional decoding apparatus.

FIG. 10 is a block diagram of a variable-length decoding apparatus which is applied to JPEG in the second embodiment of the present invention.

A shift-out unit 1101 receives encoded data made up of variable-length code words and additional bits. The input/output data widths of encoded data of the shift-out unit 1101 have identical numbers of bits, and are equal to or larger than a maximum code word length +maximum additional bit length. The shift-out unit 1101 mainly combines input encoded data and that present in the shift-out unit 1101 in the current cycle, and shifts out the combined data in accordance with a shift amount input from an operation controller 1105.

Encoded data output from the shift-out unit 1101 is parallelly input to an all-symbol generate decoder 1104 and left-shift unit 1102. Note that the left-shift unit 1102 comprises a shift circuit and the like. In this circuit, since the input bitstream is output from its MSB side, "left shift" is used herein.

The all-symbol generate decoder 1104 decodes symbol data (RRRR/SSSS) for all code words which form encoded data, and outputs the number N of bits (integer) obtained by adding the code length and additional bit length (SSSS).

On the other hand, the next code word, which follows the code word corresponding to symbol data decoded by the all-symbol generate decoder 1104 and additional bits, is shifted out, since the output data from the left-shift unit 1102 has undergone the left-shift process by N bits input from the all-symbol generate decoder 1104.

A specific symbol generate decoder 1103 checks if one of code words, which are registered in advance, matches encoded data output from the left-shift unit 1102. If the two data match, the decoder 1103 asserts a hit signal (="1"), and outputs the corresponding symbol data and M (integer) bits obtained by adding its code word length and additional bit length. For example, a plurality of symbols in descending order of frequency of generation are decoded by the specific symbol generate decoder 1103.

The operation controller 1105 controls (determines) the shift amount of the shift-out unit 1101. The shift amount is N+M bits if a hit signal is asserted, or is N bits if a miss has occurred.

In this way, the all-symbol generate decoder 1104 always decodes and outputs symbol data independently of hits in the specific symbol generate decoder 1103, and if a hit has occurred, two symbol data are output at the same time.

<Description of Operation>

The operation of the variable-length decoding apparatus in the second embodiment will be explained below. For the sake of simplicity, encoded data input to the variable-length decoding apparatus consists of eight different symbol data. In this case, the relationship between symbol data and code words decoded by the specific symbol generate decoder 1103 and all-symbol generate decoder 1104 is as shown in FIG. 15. The all-symbol generate decoder 1104 decodes all of eight different symbol data, and the specific symbol generate decoder 1103 decodes top three different symbol data with higher frequency of generation.

FIG. 14 shows a bit pattern of the input encoded data. In FIG. 14, A indicates additional bits, which form an arbitrary bit pattern of 0s or 1s. Also, the input/output encoded data width of the shift-out unit 1101 is 16 bits.

FIG. 16 shows the states of respective data in respective cycles, and the data states will be explained below.

In cycle 0, the shift-out unit 1101 shifts out code word "00" (which is 2-bit data as can be seen from FIG. 15). This code word "00" is decoded by the all-symbol generate decoder 1104, and 0/1 (RRRR/SSSS) is output as symbol data. Also, N=3 bits as the sum of 2 bits (code word length) and 1 bit (additional bit length) is output to the left-shift unit 1102. The left-shift unit 1102 left-shifts encoded data input from the shift-out unit 1101 by N=3 bits, and outputs the shifted data to the specific symbol generate decoder. "Zeros" in ( ) in FIG. 16 are padded by the left-shift unit 1101. The specific symbol generate decoder 1103 checks if the encoded data input from the left-shift unit 1102 matches one of three code words "00", "01", and "100" which are registered in advance. In the output from the left-shift unit 1102 in cycle 0, since code word "01" is shifted out, the specific symbol generate decoder 1103 asserts a hit signal, and outputs symbol data 0/2 and M=4 bits to the operation controller 1105.

On the other hand, the operation controller generates a shift amount for the shift-out unit 1101 under the following condition. Note that L bits represent the data size and S bits represent the shift amount in the shift-out unit 1101 in the current cycle.

If hit occurs:
  IF (L>N) THEN
    IF ((L−N)>M) THEN
      S=N+M
    ELSE
      S=N
    END IF
  ELSE
    S=0
  END IF If miss occurs:
  IF (L>N) THEN
    S=N
  ELSE
    S=0
  END IF In cycle 0, since the code word hits the specific symbol generate decoder 1103 and (L−N)>M, N+M=7 bits is output as the shift amount. Also, both a symbol data 2 enable signal indicating that symbol data output from the specific symbol generate decoder 1103 is enabled, and a symbol data 1 enable signal indicating that symbol data output from the all-symbol generate decoder 1104 is enabled are asserted (="1").

In cycle 1, the shift-out unit 1101 shifts out code word "1011", and the all-symbol generate decoder 1104 outputs symbol data 0/4 and N=8 bits. In the left-shift unit 1102, although code word "11011" is shifted out, since this code word is not registered in the specific symbol generate decoder 1103, a miss occurs, and a hit signal is deasserted (="0"). Hence, the shift amount S=8 bits is output to deassert the symbol data 2 enable signal and assert the symbol data 1 enable signal. The same operations are repeated for cycles 2 and 3.

In cycle 4, the data size of only 8 bits is present in the shift-out unit 1101. The all-symbol generate decoder 1104 decodes shifted-out code word "00" and outputs symbol data 0/1 and N=3 bits. In the output of the left-shift unit 1102, code word "100" is shifted out, and the specific symbol generate decoder 1103 generates symbol data 0/3. However, since category SSSS=3, the additional bit length is 3 bits, and M=6 bits is output. However, the number of effective bits input from the left-shift unit 1102 to the specific symbol generate decoder 1103 in the current cycle is L−N=8−3=5 bits, which are smaller than M bits. Therefore, although a hit has occurred upon a code word, the shift-out unit 1101 does not execute a shift-out process, and a symbol data 2 enable instruction signal is deasserted. Hence, in cycle 4, the variable-length decoding apparatus outputs only one symbol data.

In cycle 5, code word "100", decoding of which was tried by the specific symbol generate decoder 1103 in the previous cycle, is decoded again by the all-symbol generate decoder 1104. Also, the specific symbol generate decoder 1103 decodes code word "00", thus outputting two symbol data.

With the aforementioned arrangement and operation, the throughput of the variable-length decoding apparatus can be improved, although such improvement is hardly attained in the prior art. Furthermore, even in variable-length encoded data which is made up of Huffman code words and additional bits used in JPEG, two symbol data can be output at the same time in a single decoding sequence.

Third Embodiment

Figure 17:
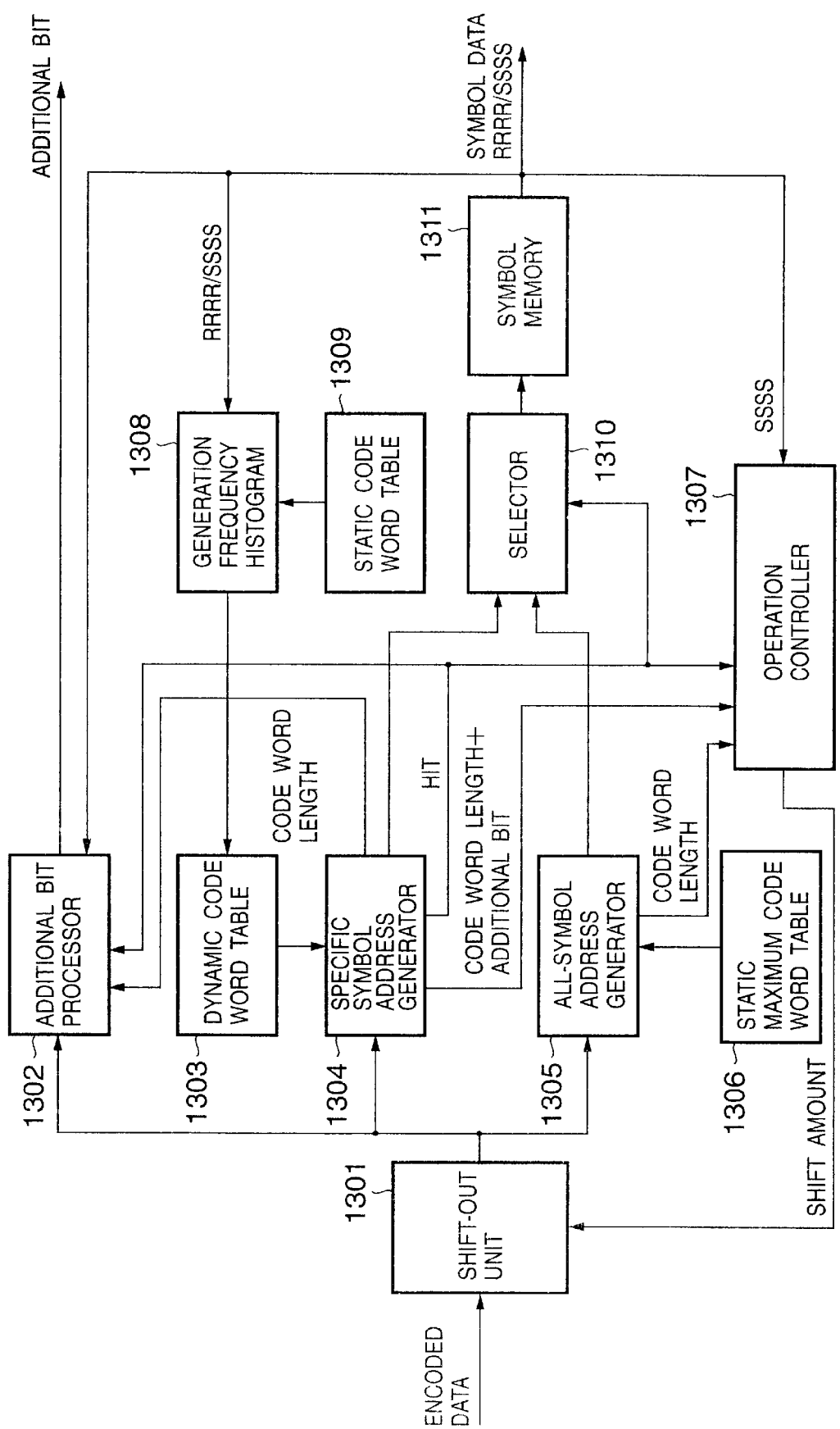
FIG. 17 is a block diagram of a decoding apparatus according to the third embodiment of the present invention.

FIG. 17 is a block diagram of a variable-length decoding apparatus according to the third embodiment of the present invention.

In the variable-length decoding apparatus in the third embodiment, symbol data as decoding results are stored in a single symbol memory 1311 as a synchronous RAM. Address generation of that memory is implemented by two means, i.e., a specific symbol address generator 1304 and all-symbol address generator 1305. The specific symbol address generator 1304 obtains the number of bits for a code word length+additional bit length for some limited symbols of all symbols present in encoded data, and the all-symbol address generator 1305 obtains a code word length for each of all symbols. The latency required for the variable-length decoding apparatus to decode one symbol data is two cycles. When the shift amount shifted out by a shift-out unit 1301 hits in the specific symbol address generator 1304, since the shift-out unit 1301 shifts out a code word and additional bits in one cycle, the next symbol can be decoded in the next cycle, and a throughput of maximum of 1 symbol/cycle can be obtained. That is, how to select symbols to be decoded by the specific symbol address generator 1304 largely influences the throughput. Hence, in the third embodiment, the frequency of generation of symbol data output from the symbol memory 1311 is measured, and a plurality of symbols in descending order of frequency of generation are decoded by the specific symbol address generator 1304. Furthermore, these symbols to be selected are dynamically replaced in turn.

<Detailed Description of Operation>

The operation of the variable-length decoding apparatus of the third embodiment will be described below. For the sake of simplicity, assume that there are 26 different code words A to Z in ascending order of absolute value as variable-length codes.

The number of symbols to be decoded by the specific symbol address generator 1304 is three.

Figure 18:
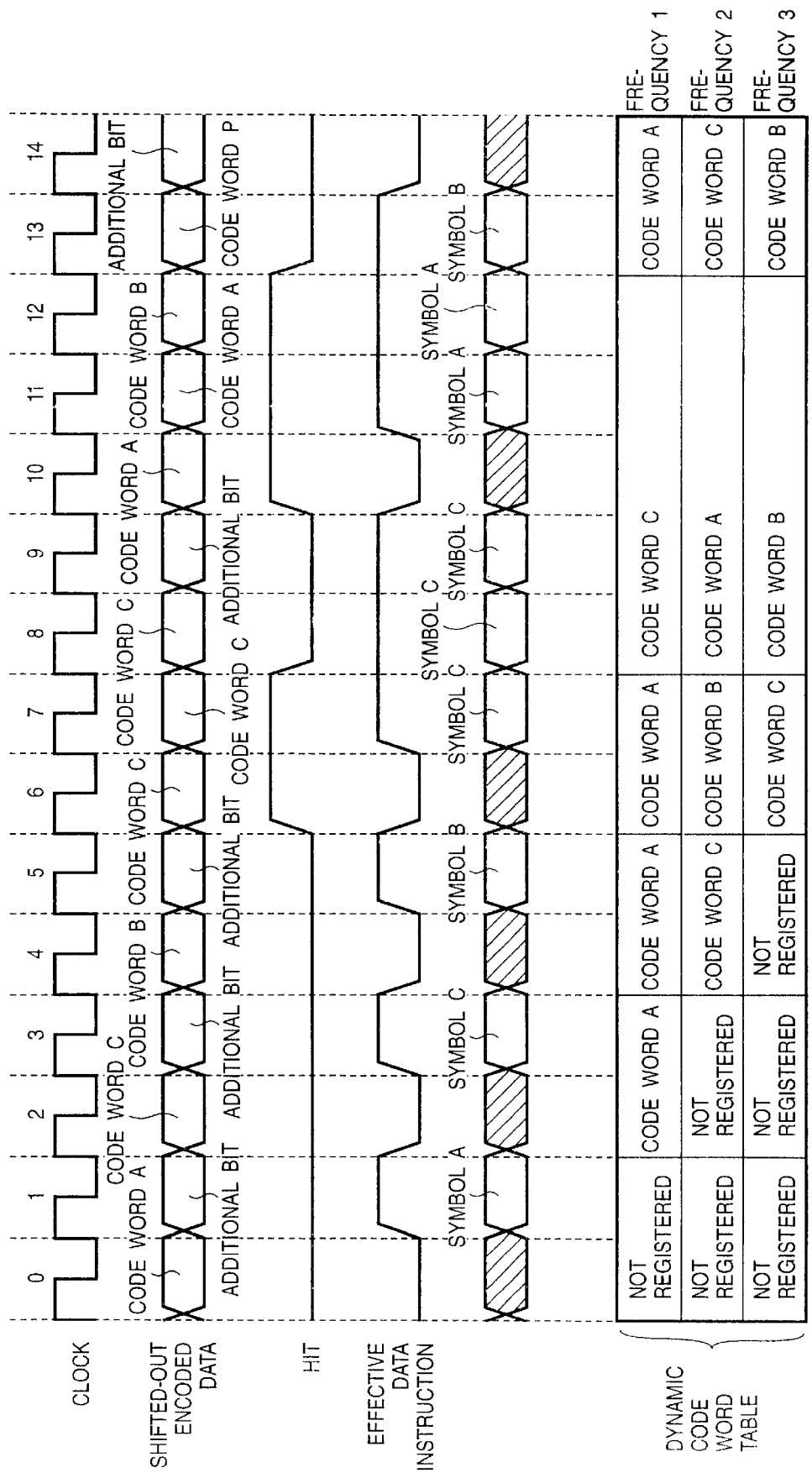
FIG. 18 is a timing chart showing the sequence of a variable-length decoding apparatus in the third embodiment, and correspondence with three code words registered in a dynamic code word table 1303.

FIG. 18 is a timing chart of the variable-length decoding apparatus and also shows three code words registered in a dynamic code word table 1303, and a sequence. If symbols have the same frequency of generation, a symbol corresponding to a code word having a smaller absolute value is preferentially selected.

In cycle 0, the shift-out unit 1301 shifts out code word A. Since this cycle is the first cycle of the decoding process, no code words are registered in the dynamic code word table. Hence, a miss has occurred in the specific symbol address generator 1304, and the address generated by the all-symbol address generator 1305 is selected by a selector 1310 as the address of the symbol memory 1311.

Figure 19:
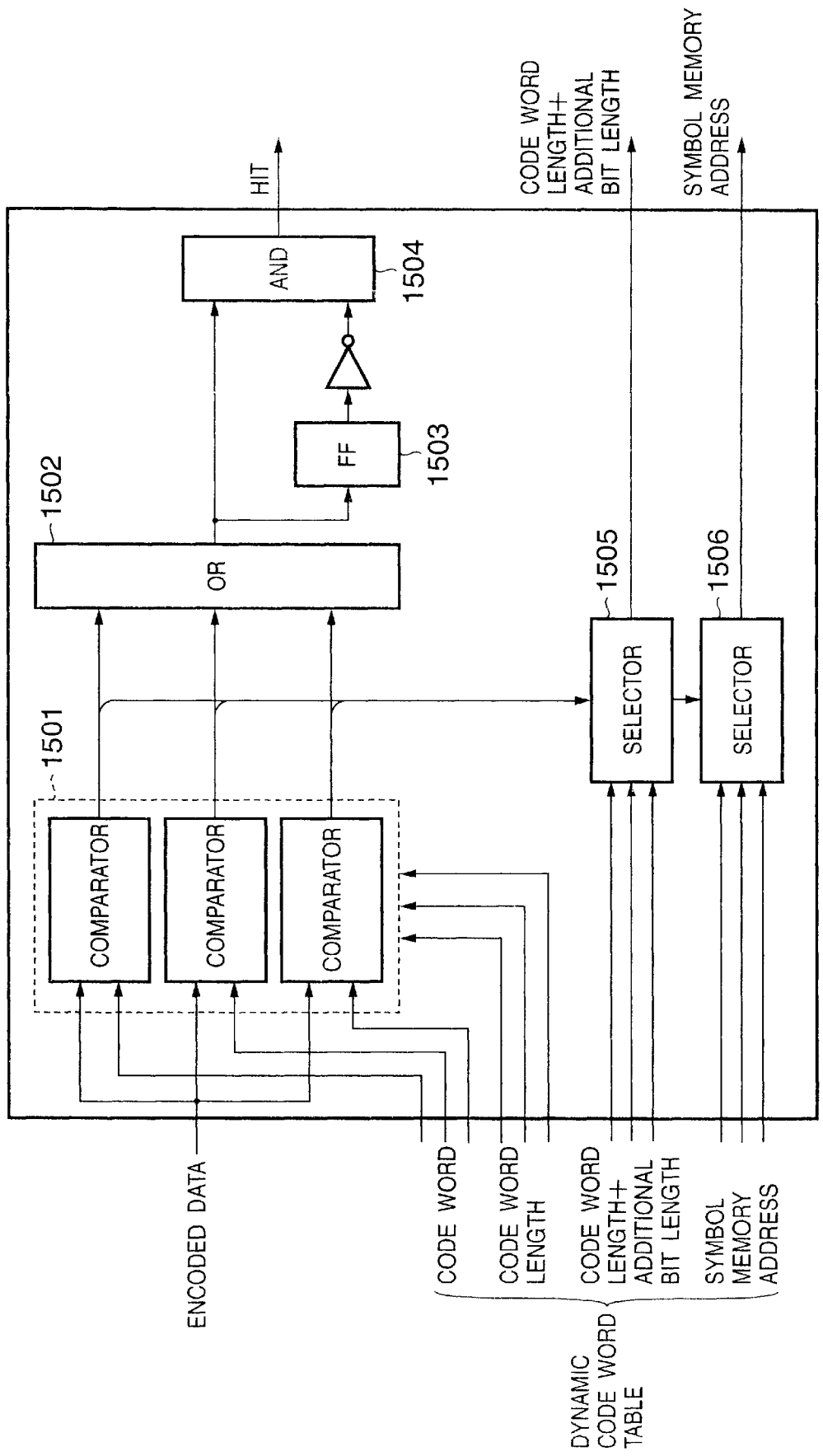
FIG. 19 is a block diagram showing the internal arrangement of a specific symbol address generator 1304 in FIG. 17.

The internal arrangement of the specific symbol address generator 1304 is as shown in FIG. 19. The specific symbol address generator 1304 operates as follows in this cycle. That is, a comparator group 1501 determines based on three different code words and code lengths input from the dynamic code word table 1301 that the input encoded data does not match any of these code words, and the hit signal remains deasserted (="0").

On the other hand, the all-symbol address generator 1305 obtains a code length by comparing with a maximum code word as a maximum absolute value present in each code length as in the conventional method. This maximum code word is input from a static maximum code word table 1306. In this case, a setup of maximum code words in the static maximum code word table 1306 must be completed before the beginning of decoding of the variable-length decoding apparatus, and table entry values remain unchanged during decoding like the dynamic code word table 1303.

In cycle 1, the symbol memory 1311 outputs symbol data corresponding to the address generated by the all-symbol address generator 1305 in the previous cycle, and this data is used as the output of this variable-length decoding apparatus. Since the shift-out unit 1301 shifted out encoded data by the code word length in the previous cycle, the additional bits of this symbol data have already been shifted out by the shift-out unit 1301.

Figure 20:
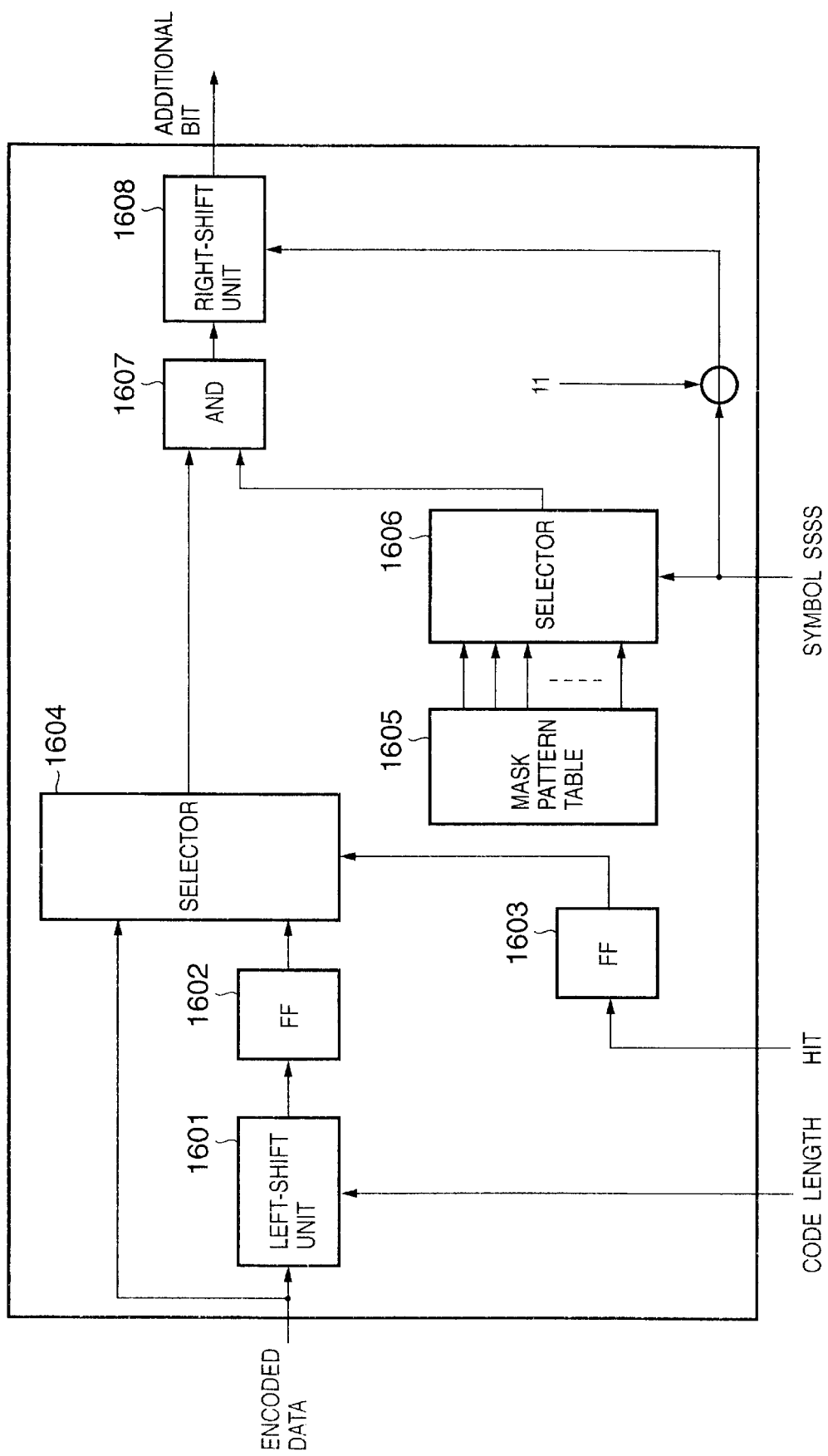
FIG. 20 is a block diagram showing the internal arrangement of an additional bit processor 1302 in FIG. 17.

Furthermore, an additional bit length can be obtained from symbol data by a known method, and is output after a right shift process. The internal arrangement of an additional bit processor 1302 is as shown in FIG. 20 (the contents of a mask pattern table 1605 in FIG. 20 are as shown in FIG. 25). If a hit has occurred in the specific symbol address generator 1304, since the code word+additional bits are shifted out from the shift-out unit 1301 in one cycle, a flip-flop 1602 temporarily latches data which has been shifted to the left by the code word length, and a right shift process is executed in the next cycle.

A static code word table 1309 pre-stores code words, code lengths, code lengths+additional bit lengths, and symbol memory addresses of all symbols or a plurality of symbols with higher frequency of generation. In the static code word table 1309, a setup of entries must be completed before the beginning of decoding of the variable-length decoding apparatus, like in the static maximum code word table 1306, and entry values remain unchanged.

A generation frequency histogram 1308 counts the frequency of generation of symbol data present in the static code word table 1309 in accordance with the output from the symbol memory 1311 to select top three symbol data with higher frequency of generation, which are supplied to the dynamic code word table 1303.

When the operations in cycles 0 and 1 are repeated up to cycle 5, three different data, i.e., code words A, B, and C are selected in the dynamic code word table 1303.

In cycle 6, the shift-out unit 1301 shifts out code word C. Since code word C is present in the dynamic code word table 1303, a hit is determined in the specific symbol address generator 1304. Hence, the shift-out unit 1301 simultaneously shifts out code word C and additional bits during cycle 6, and shifts out the next code word in the next cycle 7.

As for cycle 7, a symbol with high frequency of generation can always be processed by the specific symbol address generator 1304 by counting the frequency of generation based on the output from the symbol memory 1311, thus improving the throughput.

In the third embodiment, only three different symbols are selected in the dynamic code word table 1303, but all symbols in maximum may be selected by a trade-off with the gate scale. Also, the types of code words are limited to code words A to Z for the sake of simplicity, but this embodiment can be applied to any Huffman codes.

Fourth Embodiment

Figure 21:
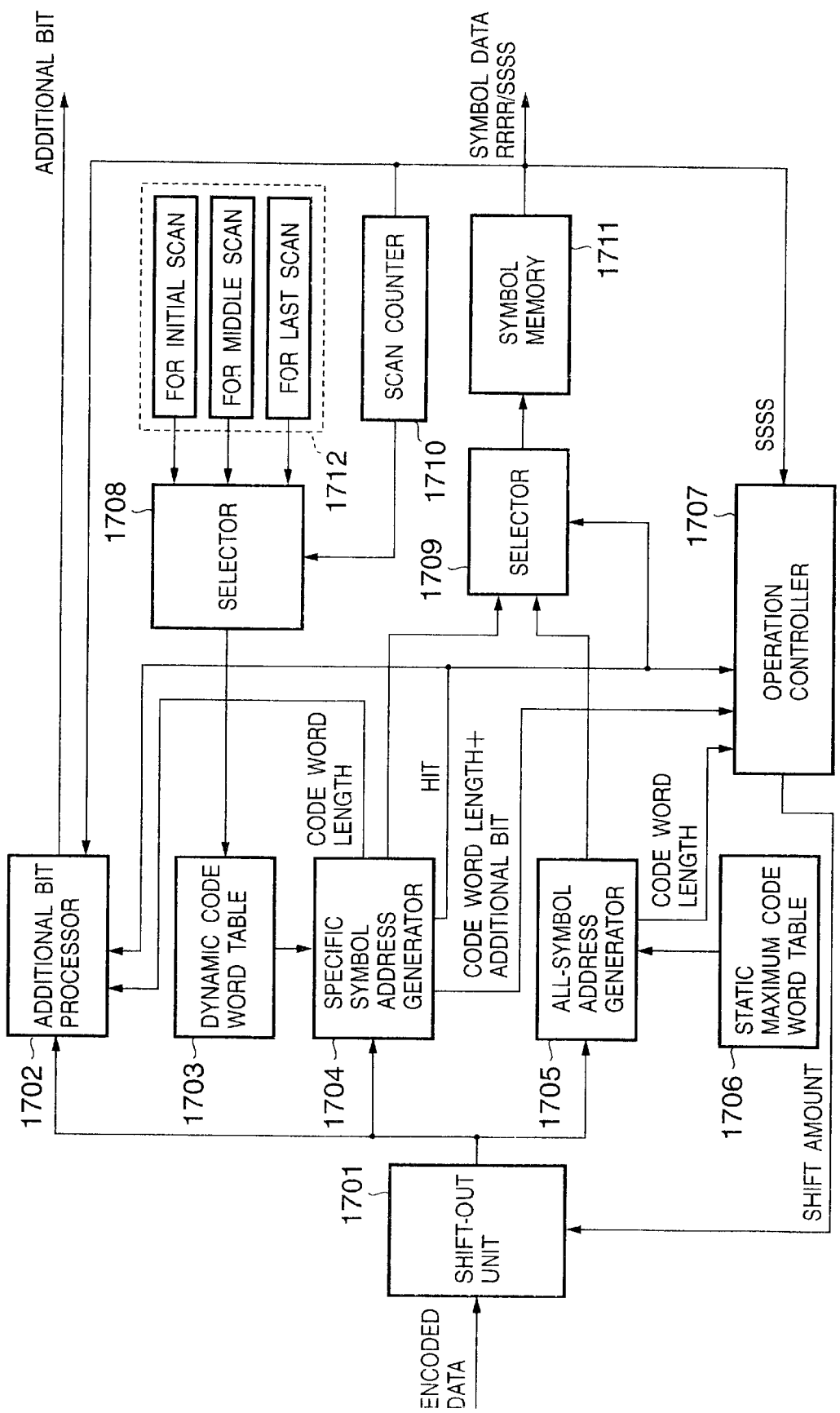
FIG. 21 is a block diagram of a decoding apparatus according to the fourth embodiment of the present invention.

The fourth embodiment will be described in detail below. FIG. 21 is a block diagram of a variable-length decoding apparatus in the fourth embodiment.

Figure 22:
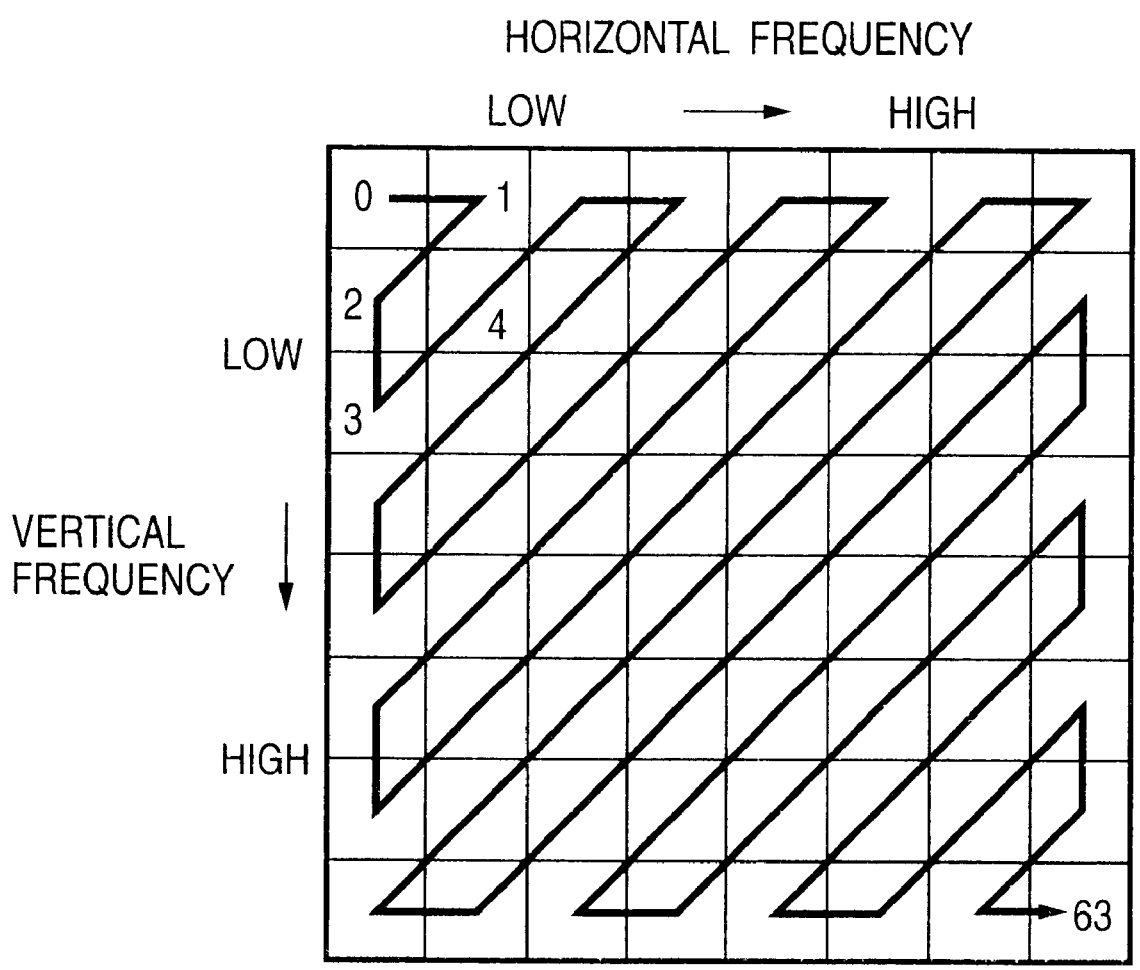
FIG. 22 shows a zigzag scan of DCT coefficients.
Figure 23:
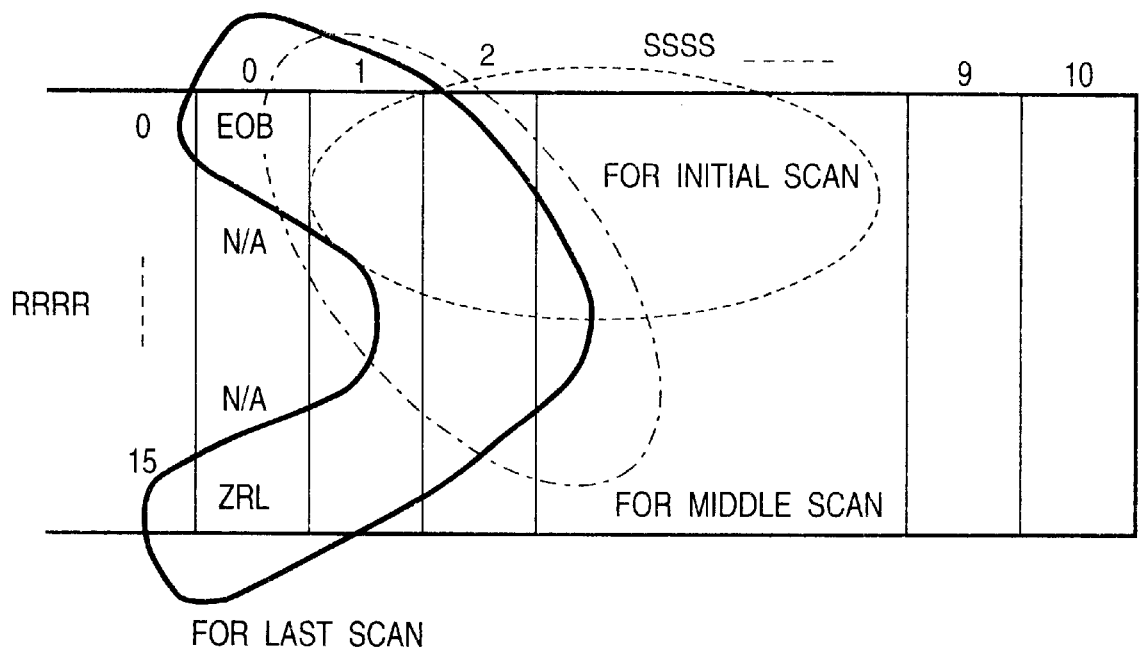
FIG. 23 shows a combination of RRRR/SSSS in the fourth embodiment.

In general, in JPEG, an 8×8 block that has undergone a DCT arithmetic process is quantized, and the quantization coefficients undergo an entropy coding process. FIG. 22 shows the state of zigzag transformation (zigzag scan) of a DCT block. The order DCT coefficients are input to a variable-length encoding apparatus is that after zigzag transformation. As for DC components, a one-dimensional entropy coding process is done to have a difference value from the previous DCT block as SSSS by a method called DCPM. After that, 63 successive DCT coefficients undergo a two-dimensional entropy coding process of two-dimensional RRRR/SSSS. FIG. 23 shows combinations of RRRR/SSSS. In case of around 1/10 as a normal compression ratio in an image compressed by JPEG, combinations of RRRR/SSSS generated are offset depending on the positions (scan count values) of DCT coefficients in the zigzag order.

In the fourth embodiment, a specific symbol address generator 1704 selects a symbol (RRRR/SSSS) to be decoded in accordance with a scan count value in consideration of the above phenomenon, thereby improving the throughput.

<Detailed Description of Operation>

The operation of the decoding process is substantially the same as in the third embodiment, except for entry of code words to a dynamic code word table 1703. In the fourth embodiment, a plurality of tables that select symbols with high frequency of generation corresponding to the scan count values are prepared before the beginning of the decoding process. For example, in the fourth embodiment, three different tables are prepared in advance in correspondence with an initial scan (scan count values 1 to 23), middle scan (24 to 40), and last scan (41 to 63). The number of symbol entries in each table is a trade-off with the gate scale. If the system of the third embodiment is used, three different symbols are set in each table. In this way, as the scan count value is counted up, the specific symbol address generator 1704 selects a symbol to be processed at high speed, thus improving the hit rate and the throughput.

Fifth Embodiment

The fifth embodiment will be described below.

Figure 24:
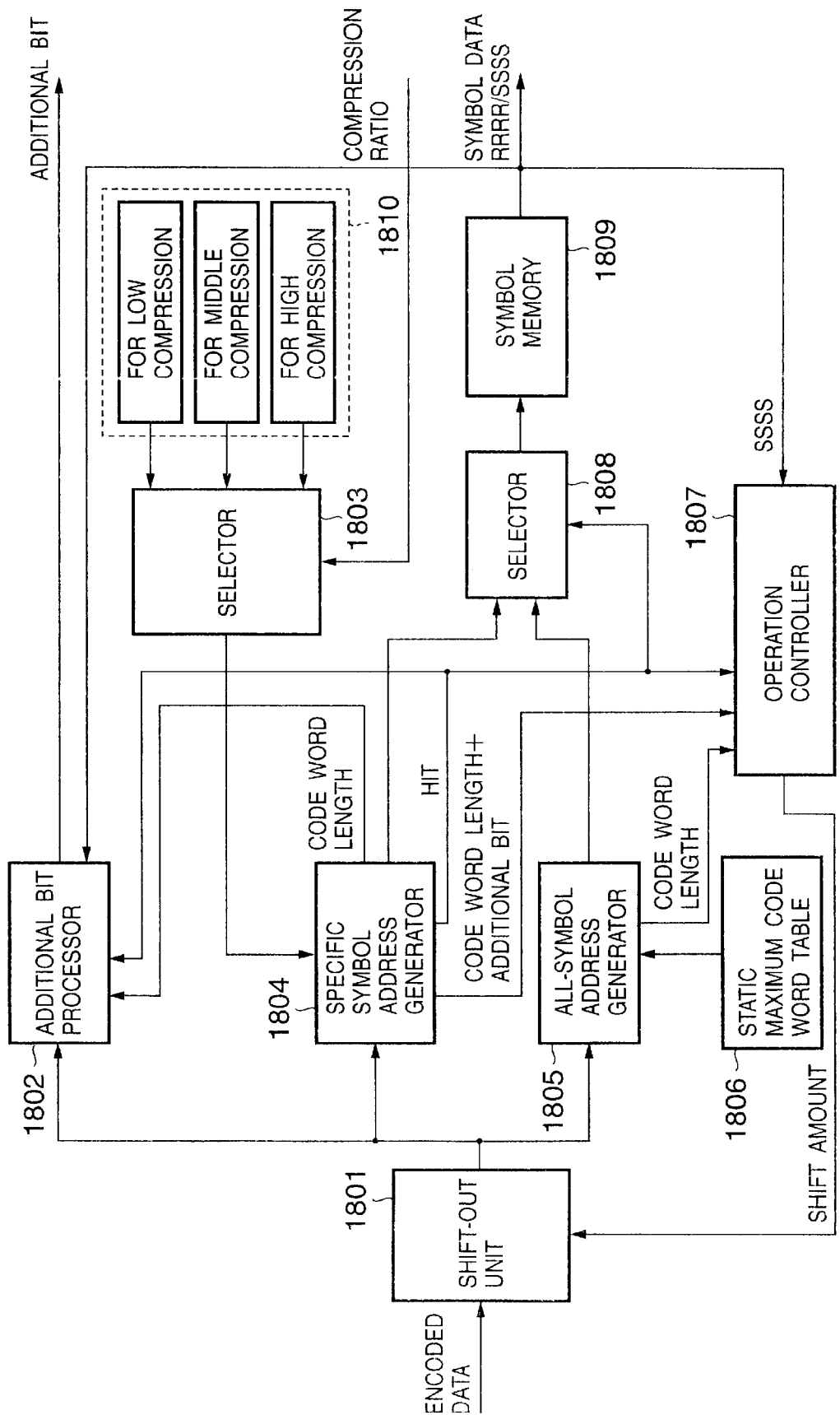
FIG. 24 is a block diagram of a decoding apparatus according to the fifth embodiment of the present invention.

FIG. 24 is a block diagram showing an apparatus in the fifth embodiment.

<Outline of Arrangement>

In general, in encoded data with low compression ratio, the frequency of generation of symbols with a small runlength value is high. Conversely, in encoded data with high compression ratio, the frequency of generation of symbols with a large runlength value is high.

Hence, in the fifth embodiment, an optimal one of a plurality of tables, which are prepared in advance, is selected in accordance with the compression ratio of encoded data to be decoded, so as to select a symbol (RRRR/SSSS) to be decoded by a specific symbol address generator 1804, thereby improving the throughput.

<Detailed Description of Operation>

The arrangement and operation of this embodiment are substantially the same as those in the third embodiment except for a supply unit of code words, code word lengths, code word lengths+additional bit lengths, and symbol memory addresses to the specific symbol address generator 1804.

Before the beginning of decoding, the compression ratio of encoded data to be decoded is set from an apparatus outside the variable-length decoding apparatus. A selector 1808 selects one of tables, which are prepared in advance, in accordance with that compression ratio, and inputs the selected table to the specific symbol address generator 1804. In this embodiment, the selected table remains unchanged during decoding.

As described above, according to the third to fifth embodiments, by adaptively selecting symbols which are to undergo a high-speed decoding process, the throughput can be improved compared to the prior art.

Sixth Embodiment

The sixth embodiment will be described below.

<Apparatus Arrangement>

Figure 26:
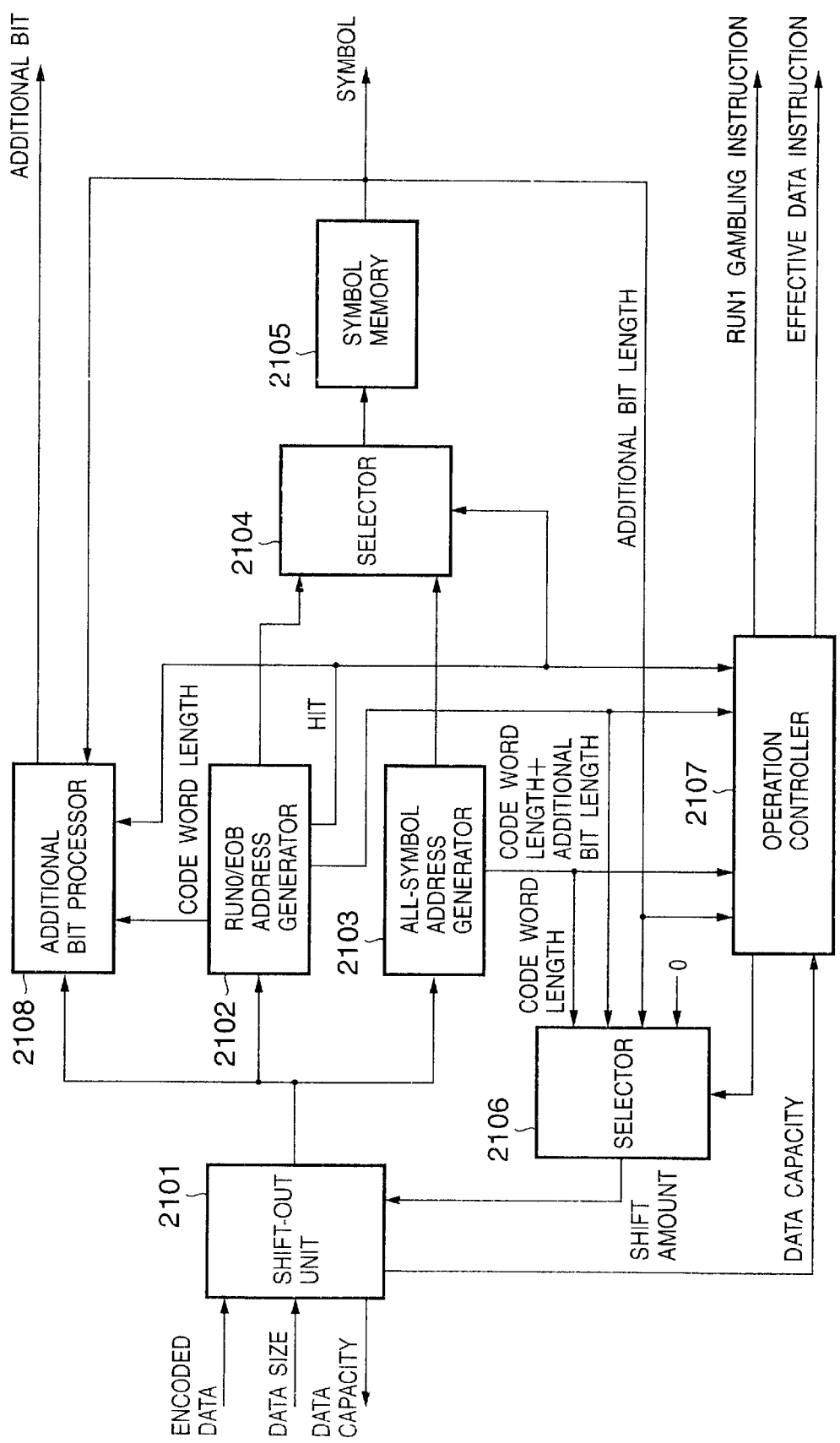
FIG. 26 is a block diagram of a decoding apparatus according to the sixth embodiment of the present invention.

FIG. 26 is a block diagram of a decoding apparatus of the sixth embodiment.

Figure 27:
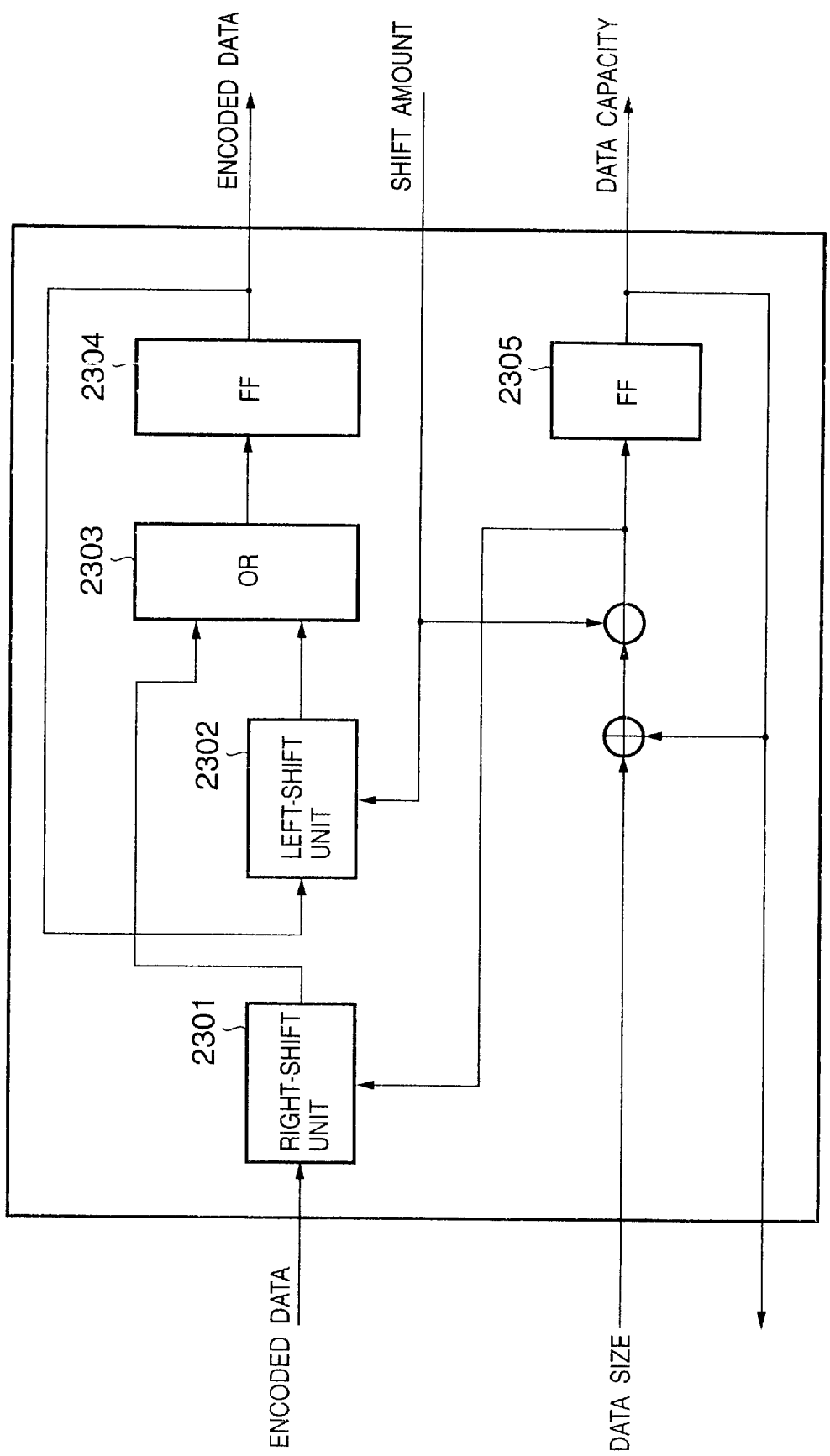
FIG. 27 is a block diagram showing the arrangement of a shift-out unit 1201 in FIG. 26.

The arrangement of the decoding apparatus will be explained first. Encoded data input to this decoding apparatus is input to a shift-out unit 2101. FIG. 27 shows the arrangement of the shift-out unit 2101. The input encoded data is shifted by a right-shift unit 2301 to be coupled to the final effective bit of encoded data output from a left-shift unit 2302. On the other hand, a flip-flop 2304 outputs the shifted-out encoded data to a RUN0/EOB address generator 2101 and all-symbol address generator 2103, and supplies it to the left-shift unit 2302. The left-shift unit 2302 shits bits corresponding to the shift amount input from an operation controller 2107 to the left.

On the other hand, an input apparatus to this variable-length decoding apparatus inputs encoded data to the variable-length decoding apparatus if the data size to be input to the variable-length decoding apparatus in the current cycle is equal to or smaller than a value obtained by subtracting the data size from the data bus width of encoded data.

Figure 28:
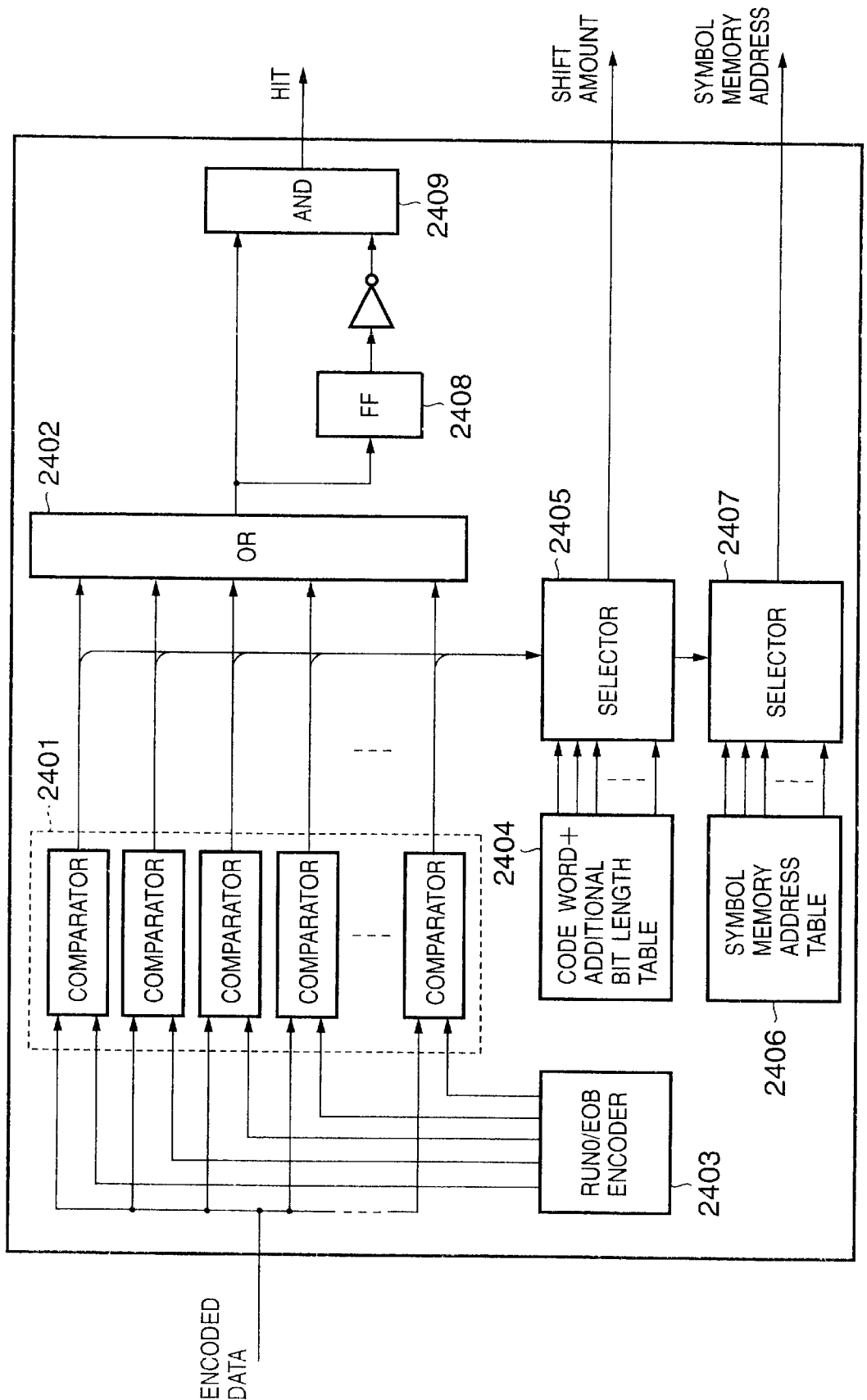
FIG. 28 is a block diagram showing the internal arrangement of a RUN0/EOB address generator 2102 in FIG. 26.

FIG. 28 shows the internal arrangement of the RUN0/EOB address generator 2102. When the runlength is "0" and a code word corresponding to an EOB symbol is shifted out, the RUN0/EOB address generator 2102 outputs an address of a symbol memory and a shift amount. These data are respectively stored in a code word length+additional bit length table 2404 and symbol memory address table 2405 as the code word length+additional bit length corresponding to zero runlength and EOB symbol, and the address of the symbol memory.

Comparators of a comparator group 2401 receive code words corresponding to zero runlength and EOB, and check if they match. If at least one of the comparators of the comparator group 2401 matches a code word, data corresponding to that code word are selected from two tables, i.e., the code word length+additional bit length table 2404 and symbol memory address table 2405 and are output. At the same time, a hit signal is asserted.

Figure 29:
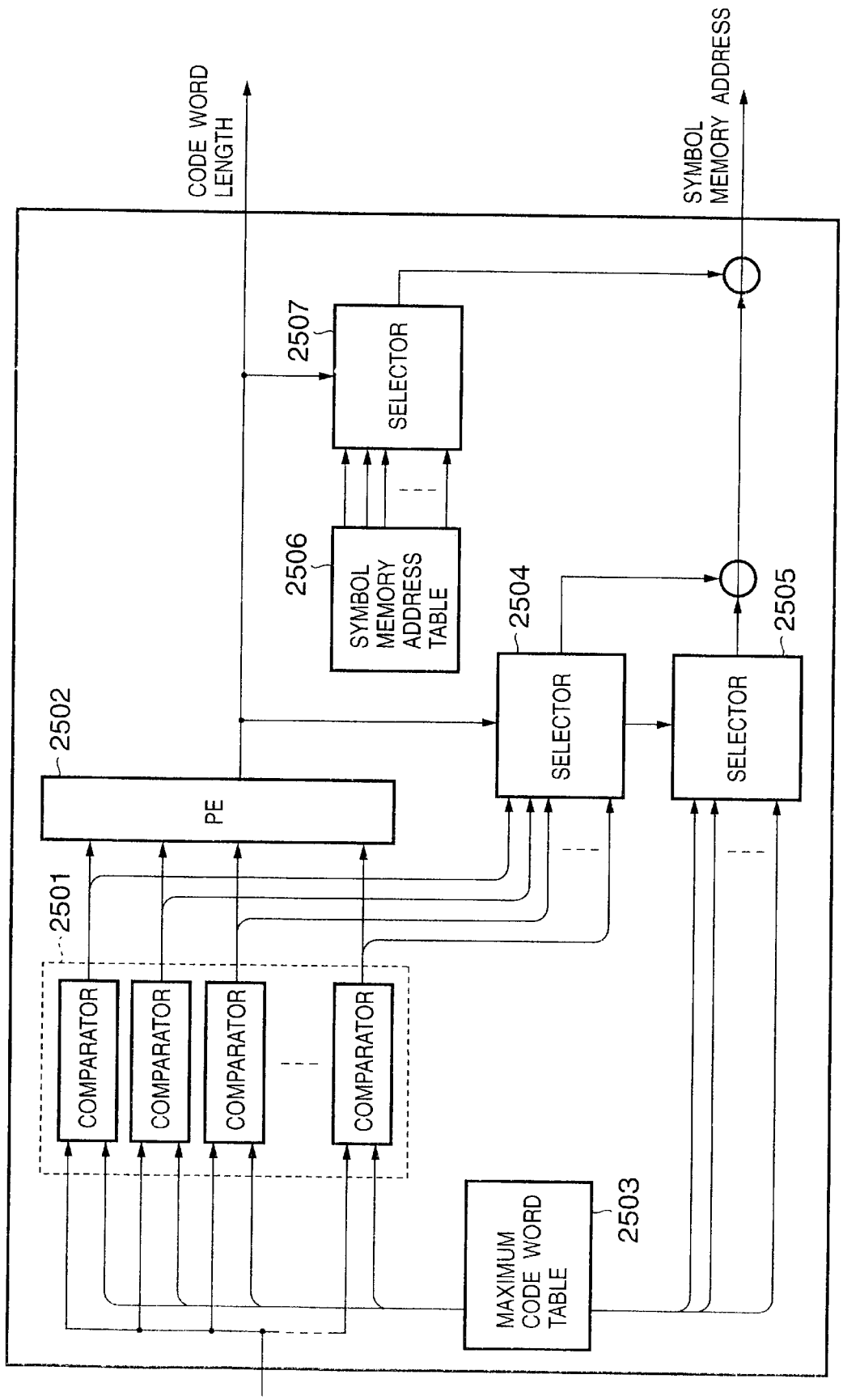
FIG. 29 is a block diagram showing the internal arrangement of-an all-symbol address generator 2103 in FIG. 26.

FIG. 29 shows the internal arrangement of the all-symbol address generator 2103. The all-symbol address generator 2103 outputs at least a code word and an address of a symbol memory 2105 corresponding to a symbol which is not registered in the RUN0/EOB address generator 2102. An implementation means of the all-symbol address generator 2103 uses known prior art. Encoded data is compared with maximum code words for respective code word lengths in a comparator group 2501. The outputs from comparators are supplied to a priority encoder 2502 which is given higher priority in ascending order of code length.

In this case, a minimum one of code word lengths from the comparators which determined that the encoded data value is equal to or smaller than the maximum code word length is used as a code word length of the currently shifted-out code word. The address of the symbol memory assumes a value obtained by subtracting the difference from the maximum code word of the currently shifted-out code word from the value of a corresponding code length selected from a symbol memory address table 2506 that stores the addresses of maximum code words of respective code word lengths on the symbol memory.

Figure 30:
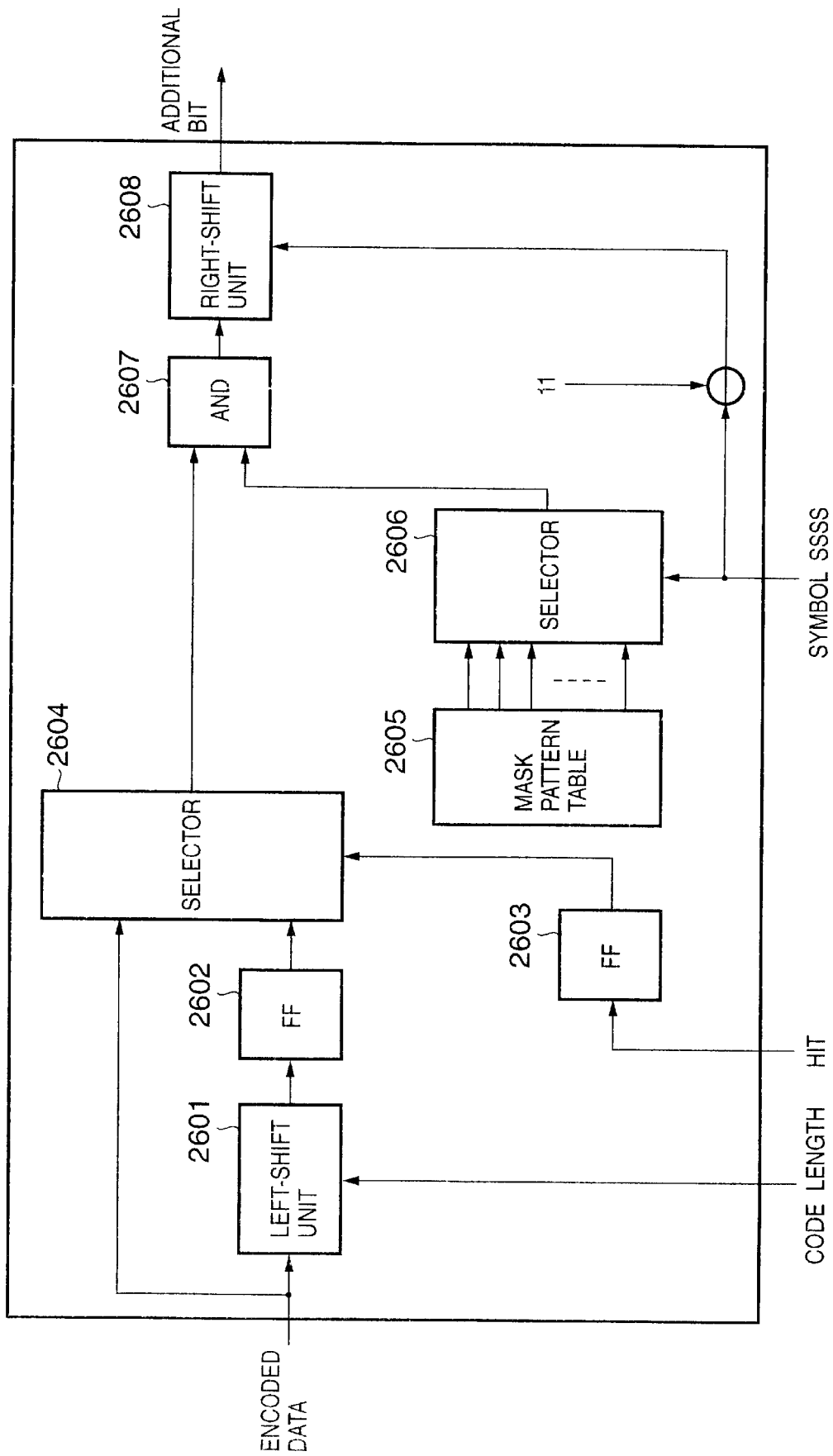
FIG. 30 is a block diagram showing the internal arrangement of an additional bit processor 2108 in FIG. 26.

FIG. 30 shows the internal arrangement of an additional bit processor 2108. The processing sequence of additional bits varies depending on whether or not a hit has occurred in the RUN0/EOB address generator 2102. If a hit has occurred, encoded data is shifted to the left by a code length, and is then delayed by one clock by a flip-flop 2602. A hit signal is delayed by one cycle by a flip-flop 2603 to be used as a select signal of a selector 2604, and if a hit has occurred, the output from the flip-flop 2602 is selected. The output from the selector 2604 is logically ANDed with a bit pattern selected from a mask pattern table 2605 in accordance with symbol SSSS. The relationship between the mask pattern and SSSS is the same as that shown in FIG. 25. The AND signal undergoes a right shift process for the number of bits obtained by subtracting the value of symbol SSSS from 11, and the shift process result is output as additional bits.

The operation of the operation controller 2107 will be described below.

The operation controller 2107 compares the data size present in the shift-out unit 2101 in the current cycle with the code word length+additional bit length input from the RUN0/EOB address generator 2102 if a hit has occurred, or with the code word length input from the all-symbol address generator 2103 if a miss has occurred. If the data size is smaller than the input value, a selector 2106 selects zero shift amount until a cycle in which the data size becomes equal to or larger than the input value. The shift amount is the code word length+additional bit length if a hit has occurred in the RUN0/EOB address generator 2102, or is the code word length in the first cycle and the additional bit length in the next cycle if a miss has occurred. If two code words have successively been missed, a RUN1 gambling execution process for outputting information indicating a runlength="1" to the subsequent blocks is executed in the first cycle. A miss that has occurred in the RUN0/EOB address generator 2102 means a runlength="1" or more. In this manner, the subsequent blocks of the variable-length decoding apparatus can execute a variable-length decoding process without lowering the throughput even when the all-symbol address generator 2103 that requires two processing cycles executes processes.

<Description of Operation>

Figure 31:
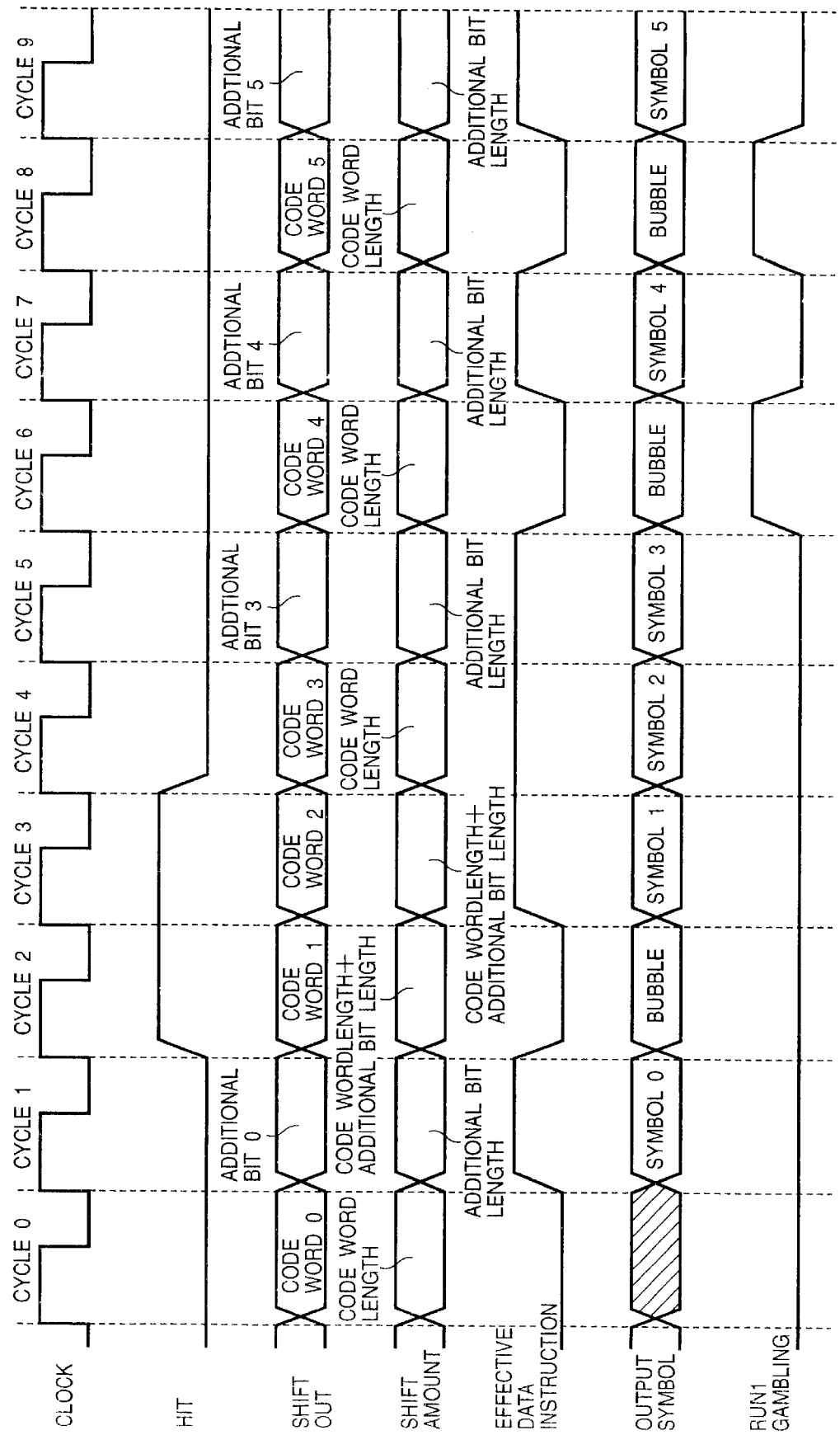
FIG. 31 is a timing chart showing, as a sequence, an operation example of the variable-length decoding apparatus of the sixth embodiment.

FIG. 31 is a timing chart showing an operation example of the variable-length decoding apparatus of the sixth embodiment.

Cycle 0 indicates that encoded data output from the shift-out unit 2101 is parallelly processed by the RUN0/EOB address generator 2102 and all-symbol address generator 2103 and, consequently, a miss has occurred in the RUN0/EOB address generator 2102. Hence, the selector 2104 selects the symbol memory address input from the all-symbol address generator 2103, and the selector 2106 selects a code word length as a shift amount in the operation controller. In case of a processing cycle for DC components, even when a miss has occurred in the RUN0/EOB address generator 2102, no RUN1 gambling execution is made. In the sixth embodiment, a synchronous RAM is assumed as the symbol memory 2105.

In cycle 1, the shift-out unit 2101 shifts out additional bits corresponding to code word 0.

The additional bit lengths are the value of symbol SSSS output from the symbol memory 2105. The additional bit generator 2108 generates additional bits on the basis of this symbol SSSS, and outputs these its to subsequent blocks together with symbol data output from the symbol memory 2105. At this time, the operation controller 2107 asserts an effective data instruction signal (="1") to inform the subsequent blocks that the variable-length decoding apparatus outputs effective symbol and additional bit data in the current cycle 1. Also, the operation controller 2107 selects the additional bit length as a shift amount.

In cycle 2, the shift-out unit 2101 shifts out code word 1 of AC components. Since this shifted-out code word 1 matches a code word registered in advance in a RUN0/EOB code word table 2403 in the RUN0/EOB address generator 2102, a hit signal is asserted (="1"). Hence, as the address of the symbol memory, the selector 2104 selects the output of the RUN0/EOB address generator 2102, and the selector 2106 selects the code word length+additional bit length as a shift amount.

In the next cycle 3, the symbol memory 2105 outputs symbol data corresponding to code word 1. In this state, the shift-out unit 2101 has already shifted out additional bits corresponding to code word 1. For this reason, the additional bit processor 2108 latches data obtained by shifting out code word 1 to shift out additional bits in the flip-flop 2602 in cycle 2. In this way, additional bits can be generated based on symbol SSSS output from the symbol memory in cycle 3.

In cycles 3, 4, and 5, the same operations as in cycles 0, 1, and 2 are repeated.

In cycle 6, code word 4 shifted out by the shift-out unit 2101 is not registered in the RUN0/EOB code word table 2403 in the RUN0/EOB address generator 2102, and a miss occurs. Since a similar miss occurred in cycle 4, two code words successively shifted out by the shift-out unit 2101 are missed. In this case, symbol data which is effective in terms of pipeline operations in the arrangement of the variable-length decoding apparatus cannot be output, and a bubble cycle is generated. Hence, to avoid a decrease in throughput, a signal indicating RUN1 gambling execution as information indicating a runlength="1" is asserted (="1") in cycle 6.

In the subsequent cycle 7, symbol data and additional bits corresponding to code word 4 are output. In cycle 8 as well, since a miss has occurred in the RUN0/EOB address generator 2102, RUN1 gambling execution is made as in cycle 6. In the next cycle 9, symbol data and additional bits corresponding to code word 5 are output.

As described above, according to the sixth embodiment, the RUN0/EOB address generator 2102 is arranged parallel to the all-symbol address generator 2103 that uses prior art, so as to improve the throughput compared to the prior art while suppressing an increase in the number of gates. In order to allow operations at high-speed clock operation frequency, the identical processing latency of the RUN0/EOB address generator 2102 is set equal to the all-symbol address generator 2103 to implement a pipeline process. In order to prevent a bubble cycle generated in the pipeline process, RUN1 gambling execution is made to further improve the throughput.

When the all-symbol address generator 2103 executes decoding corresponding to RUN1 symbol data, RUN1 gambling execution works very effectively in the subsequent block for converting symbol data into orthogonal coefficients, thus further improving the throughput. This is because RUN1 symbol data are obtained by encoding two orthogonal coefficients, i.e., an insignificant coefficient (orthogonal coefficient value=0) and nonzero significant coefficient and, in such case, a bubble cycle can be prevented in the subsequent blocks.

In the above embodiments, a hardware decoding apparatus has been explained. However, it is easy for those who are skilled in the art that a memory (table) in the apparatus arrangement of each embodiment comprises a RAM, and other processors can be implemented by a program. Therefore, the present invention can be applied not only to the decoding apparatus but also to a decoding method, a computer program, and a computer readable storage medium that stores the program (a storage medium which is used to install a program in a computer; for example, a floppy disk, CD-ROM, or the like).

As described above, the present invention can be applied to decoding of both JPEG and MPEG encoded data, and can obtain a high throughput.

As many apparently widely different embodiments of the present invention can be made without departing from the spirit and scope thereof, it is to be understood that the invention is not limited to the specific embodiments thereof except as defined in the appended claims.

What is claimed is:

1. A variable-length decoding apparatus for decoding encoded data, comprising:

shift means for shifting out a code word and an additional bit corresponding to the code word of input encoded data for each cycle;

a symbol memory for storing decoded data corresponding to a plurality of N code words contained in the input encoded data;

first decode processing means for generating an address of said symbol memory, a code length, and an additional bit length for each of Nt code words fewer than the N code words of the code words input from said shift means;

second decode processing means for generating a code length and an address of said symbol memory for each of the N code words;

address select means for selecting one of the two addresses of said symbol memory input from said first and second decode processing means;

first additional bit processing means for shifting bits of the output from said shift means to the left by the code length input from one of said first and second decode processing means;

second additional bit processing means for shifting bits of the output from said first additional it processing means to the right by an amount corresponding to symbol data output from said symbol memory; and operation control means for outputting a shift amount to said shift means.

2. The apparatus according to claim 1, wherein said first decode processing means comprises:

first table storage means for storing the Nt code words, bit counts M each obtained by adding a code length of each of the Nt code words and an appended additional bit length, and addresses of said symbol memory corresponding to the Nt code words;

Nt comparison means each for detecting if a code word output from said first table storage means matches the output from said shift means; and select means for, when one of said Nt comparison means detects a match, selecting one from each of the Nt bit counts M and addresses.

3. The apparatus according to claim 2, wherein when one of said Nt comparison means detects a match, said address select means selects the address of said symbol memory output from said first decode processing means.

4. The apparatus according to claim 1, wherein when one of said Nt comparison means in said first decode processing means detects a match, said shift means shifts out a code word and additional bit in one cycle, and when said Nt comparison means does not detect a match, said shift means shifts out a code word and additional bit in two cycles.

5. The apparatus according to claim 1, wherein said second decode processing means comprises:

second table storage means for storing minimum or maximum code words for all code lengths of the N code words;

code length determination means, including comparison means, the number of which matches the number of all the code lengths, for determining a code length of an input code word on the basis of the input code word and the minimum or maximum code word;

an initial data table for storing all initial data corresponding to the minimum or maximum code words so as to calculate an address of said symbol memory corresponding to the input code word;

third decode processing means for obtaining an address of the initial data corresponding to the code length determined by said code length determination means on the basis of the determined code length; and arithmetic means for calculating an address of said symbol memory on the basis of the input code word and the corresponding initial data.

6. A variable-length decoding method for decoding encoded data, comprising:

the shift step of shifting out a code word and an additional bit corresponding to the code word of input encoded data for each cycle;

the symbol data storage step of storing decoded data corresponding to a plurality of N code words contained in the input encoded data;

the first decode processing step of generating an address of the symbol data stored in the symbol data storage step, a code length, and an additional bit length for each of Nt code words fewer than the N code words of the code words input in the shift step;

the second decode processing step of generating a code length and an address of the symbol data for each of the N code words;

the address select step of selecting one of the two addresses of the symbol data input from the first and second decode processing steps;

the first additional bit processing step of shifting bits of the output from the shift step to the left by the code length input from one of the first and second decode processing steps;

the second additional bit processing step of shifting bits of the output from the first additional bit processing step to the right by an amount corresponding to symbol data output from the symbol data storage step; and the operation control step of outputting a shift amount to the shift step.

7. The method according to claim 6, wherein the first decode processing step comprises:

the first table storage step of storing the Nt code words, bit counts M each obtained by adding a code length of each of the Nt code words and an appended additional bit length, and addresses to said symbol memory corresponding to the Nt code words;

the Nt comparison steps each of detecting if a code word output from the first table storage step matches the output from the shift step; and the select step of selecting, when a match is detected in one of the Nt comparison steps, one from each of the Nt bit counts M and addresses.

8. The method according to claim 7, wherein the address select step includes the step of selecting, when a match is detected in one of the Nt comparison steps, the address of the symbol data output from the first decode processing step.

9. The method according to claim 6, wherein the shift step includes the step of shifting out, when a match is detected in one of the Nt comparison steps in the first decode processing step, a code word and additional bit in one cycle, and shifting out, when a match is not detected in the Nt comparison steps, a code word and additional bit in two cycles.

10. The method according to claim 6, wherein the second decode processing step comprises:

the second table storage step of storing minimum or maximum code words for all code lengths of the N code words;

the code length determination step, including the comparison steps, the number of which matches the number of all the code lengths, of determining a code length of an input code word on the basis of the input code word and the minimum or maximum code word;

the initial data storage step of storing all initial data corresponding to the minimum or maximum code words so as to calculate an address of said symbol memory corresponding to the input code word;

the third decode processing step of obtaining an address of the initial data corresponding to the code length determined in the code length determination step on the basis of the determined code length; and the arithmetic step of calculating an address of the symbol data on the basis of the input code word and the corresponding initial data.

11. A decoding apparatus for decoding variable-length encoded data, and outputting symbol data, comprising:

first shift-out means for shifting out a code word of input encoded data in accordance with shift amount select means, and outputting a head code word and subsequent encoded data;

first decode means for decoding the head code word output from said first shift-out means, and generating first symbol data and a bit length N (N is an integer) of the code word;

second shift-out means for further shifting the head code word and subsequent encoded data output from said first shift-out means on the basis of the bit length N output from said first decode means, and outputting a subsequent first code word; and second decode means for, when the subsequent first code word output from said second shift-out means belongs to one of a code word group obtained by selecting in advance some of all code words which form the encoded data, generating second symbol data as a decoding result and a bit length M (M is an integer) of the code word, wherein said shift amount select means determines, as a shift amount of said first shift-out means, a shift amount by selecting a bit length N+M obtained by adding the bit lengths N and M when said second decode means generates the second symbol data, and by selecting the bit length N in other cases.

12. The apparatus according to claim 11, wherein the selected code word group decoded by said second decode means is a code word group corresponding to some symbol data with high frequency of generation.

13. The apparatus according to claim 11, wherein the variable-length encoded data is encoded by JPEG or MPEG.

14. A decoding method for decoding variable-length encoded data, and outputting symbol data, comprising:

the first shift-out step of shifting out a code word of input encoded data in accordance with the shift amount select step, and outputting a head code word and subsequent encoded data;

the first decode step of decoding the head code word output from the first shift-out step, and generating first symbol data and a bit length N (N is an integer) of the code word;

the second shift-out step of further shifting the head code word and subsequent encoded data output from the first shift-out step on the basis of the bit length N output from the first decode step, and outputting a subsequent first code word; and the second decode step of generating, when the subsequent first code word output from the second shift-out step belongs to one of a code word group obtained by selecting in advance some of all code words which form the encoded data, second symbol data as a decoding result and a bit length M (M is an integer) of the code word, wherein the shift amount select step includes the step of determining, as a shift amount of the first shift-out step, a shift amount by selecting a bit length N+M obtained by adding the bit lengths N and M when the second symbol data is generated in the second decode step, and by selecting the bit length N in other cases.

15. A decoding apparatus for decoding variable-length encoded data, and outputting symbol data as a decoding result, comprising:

shift-out means for shifting out a code word of input encoded data in accordance with an output from shift amount select means, and outputting a head code word;

a symbol memory which pre-stores symbol data as decoded data;

dynamic code word select means for adaptively selecting some code words from all code words which form the input encoded data as a first code word group, and remaining code words as a second code word group;

first address generation means for, when the code word output from said shift-out means is a code word which belongs to the first code word group selected by said dynamic code word select means, generating a first address on said symbol memory, and a total bit length obtained by adding a bit length of the code word and a bit length of a subsequent additional bit as a shift amount of said shift-out means;

second address generation means for, at least when the code word output from said shift-out means is a code word which belongs to the second-code word group, the address of which is not generated by said first address generation means, generating a second address on said symbol memory and a bit length of the code word as a shift amount of said shift-out means; and address select means for selecting the first address when said first address generation means generates the address, and selecting the second address in other cases, wherein said symbol memory outputs symbol data as a decoding result in a subsequent cycle in accordance with an output from said address select means, said shift amount select means selects the total bit length as the shift amount of said shift-out means when said first address generation means generates the address, and said shift amount select means selects a bit length of the code word in the first cycle and a bit length of an additional bit obtained from a part of the symbol data output from said symbol memory in the next cycle when said second address generation means generates the address.

16. The apparatus according to claim 15, wherein said dynamic code word select means adaptively selects the first code word group in accordance with a distribution of frequency of generation of respective symbols output as decoding results.

17. The apparatus according to claim 15, wherein said dynamic code word select means selects the first code word group in accordance with a compression ratio of the variable-length encoded data.

18. The apparatus according to claim 15, wherein the variable-length encoded data is obtained by variable-length encoding orthogonal transformation coefficients in accordance with a predetermined sequence, and said dynamic code word select means adaptively selects the first code word group in accordance with a sequence position corresponding to a symbol.

19. A decoding method for decoding variable-length encoded data, and outputting symbol data as a decoding result, comprising:

the shift-out step of shifting out a code word of input encoded data in accordance with an output from the shift amount select step, and outputting a head code word;

the dynamic code word select step of adaptively selecting some code words from all code words which form the input encoded data as a first code word group, and remaining code words as a second code word group;

the first address generation step-of generating, when the code word output from the shift-out step is a code word which belongs to the first code word group selected in the dynamic code word select step, a first address on a symbol memory which pre-stores symbol data as decoded data, and a total bit length obtained by adding a bit length of the code word and a bit length of a subsequent additional bit as a shift amount of the shift-out step;

the second address generation step of generating, at least when the code word output from the shift-out step is a code word which belongs to the second code word group, the address of which is not generated in the first address generation step, a second address on the symbol memory and a bit length of the code word as a shift amount of the shift-out step; and the address select step of selecting the first address when the address is generated in the first address generation step, and selecting the second address in other cases, wherein the symbol memory outputs symbol data as a decoding result in a subsequent cycle in accordance with an output from the address select step, the shift amount select step includes the steps of:

selecting the total bit length as the shift amount of the shift-out step when the address is generated in the first address generation step; and selecting a bit length of the code word in the first cycle and a bit length of an additional bit obtained from a part of the symbol data output from the symbol memory in the next cycle when the address is generated in the second address generation step.

20. A decoding apparatus for decoding variable-length encoded data, and outputting symbol data as a decoding result, comprising:

shift-out means for shifting out a code word of input encoded data in accordance with an output from shift amount select means, and outputting a head code word;

a symbol memory which pre-stores symbol data as decoded data;

first address generation means for, when the code word output from said shift-out means is a code word which belongs to a first code word group corresponding to symbol data with zero runlength or EOB, generating a first address on said symbol memory, and a total bit length obtained by adding a bit length of the code word and a bit length of a subsequent additional bit as a shift amount of said shift-out means;

second address generation means for, at least when the code word output from said shift-out means is a code word which belongs to a second code word group, the address of which is not generated by said first address generation means, generating a second address on said symbol memory and a bit length of the code word as a shift amount of said shift-out means;

address select means for selecting the first address when said first address generation means generates the address, selecting the second address in other cases, and supplying the selected address to said symbol memory to make said symbol memory output symbol data as a decoding result in a subsequent cycle; and operation control means for, when said address select means selects the second address, and the second address was selected in the previous cycle, outputting symbol data with a runlength=1 as a decoding result prior to a cycle for outputting symbol data, and outputting symbol data obtained by subtracting 1 from a runlength of symbol data output from said symbol memory as a decoding result in the next cycle, wherein said shift amount select means selects the total bit length as the shift amount of said shift-out means when said first address generation means generates the address, and said shift amount select means selects a bit length of the code word in the first cycle and a bit length of an additional bit obtained from a part of the symbol data output from said symbol memory in the next cycle when said second address generation means generates the address.

21. A decoding method for decoding variable-length encoded data, and outputting symbol data as a decoding result, comprising:

the shift-out step of shifting out a code word of input encoded data in accordance with an output from the shift amount select step, and outputting a head code word;

the first address generation step of generating, when the code word output from the shift-out step is a code word which belongs to a first code word group corresponding to symbol data with zero runlength or EOB, a first address on a symbol memory which pre-stores symbol data as decoded data, and a total bit length obtained by adding a bit length of the code word and a bit length of a subsequent additional bit as a shift amount of the shift-out step;

the second address generation step of generating, at least when the code word output from the shift-out step is a code word which belongs to a second code word group, the address of which is not generated in the first address generation step, a second address on the symbol memory and a bit length of the code word as a shift amount of the shift-out step;

the address select step of selecting the first address when the address is generated in the first address generation step, selecting the second address in other cases, and supplying the selected address to the symbol memory to make the symbol memory output symbol data as a decoding result in a subsequent cycle; and the operation control step of outputting, when the second address is selected in the address select step, and the second address was selected in the previous cycle, symbol data with a runlength=1 as a decoding result prior to a cycle for outputting symbol data, and outputting symbol data obtained by subtracting 1 from a runlength of symbol data output from the symbol memory in the next cycle as a decoding result, wherein the shift amount select step includes the steps of:
selecting the total bit length as the shift amount of the shift-out step when the address is generated in the first address generation step; and selecting a bit length of the code word in the first cycle and a bit length of an additional bit obtained from a part of the symbol data output from the symbol memory in the next cycle when the address is generated in the second address generation step.

* * * * *

UNITED STATES PATENT AND TRADEMARK OFFICE
CERTIFICATE OF CORRECTION

PATENT NO. : 6,603,413 B2  Page 1 of 1
APPLICATION NO. : 10/067223
DATED : August 5, 2003
INVENTOR(S) : Susumu Igarashi et al.

It is certified that error appears in the above-identified patent and that said Letters Patent is hereby corrected as shown below:

COLUMN 3

Line 11, "hardwired." should read --is hardwired.--.

COLUMN 5

Line 54, "of-an" should read --of an--.

COLUMN 6

Line 64, "VLC-" should read --VLC--.

COLUMN 15

Line 66, "its" should read --bits--.

COLUMN 17

Line 44, "it" should read --bit--.

COLUMN 21

Line 41, "step-of" should read --step of--.

Signed and Sealed this

Sixteenth Day of September, 2008

JON W. DUDAS
*Director of the United States Patent and Trademark Office*